United States Patent
Shibata et al.

(10) Patent No.: US 8,730,741 B2
(45) Date of Patent: May 20, 2014

(54) SEMICONDUCTOR MEMORY SYSTEM CAPABLE OF SUPPRESSING CONSUMPTION CURRENT

(75) Inventors: Noboru Shibata, Kawasaki (JP); Hiroshi Sukegawa, Tokyo (JP); Tokumasa Hara, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 272 days.

(21) Appl. No.: 13/371,931

(22) Filed: Feb. 13, 2012

(65) Prior Publication Data

US 2012/0206977 A1 Aug. 16, 2012

(30) Foreign Application Priority Data

Feb. 14, 2011 (JP) ................................ 2011-028662
Nov. 29, 2011 (JP) ................................ 2011-260838

(51) Int. Cl.
*G11C 16/06* (2006.01)

(52) U.S. Cl.
USPC .............................. 365/185.25; 365/185.05

(58) Field of Classification Search
USPC ....................... 365/185.25, 185.05
See application file for complete search history.

(56) References Cited

U.S. PATENT DOCUMENTS

| | | | | |
|---|---|---|---|---|
| 6,021,068 A | * | 2/2000 | Miki et al. | 365/185.21 |
| 7,151,695 B2 | * | 12/2006 | Choy et al. | 365/185.25 |
| 7,200,047 B2 | * | 4/2007 | Gualandri et al. | 365/185.29 |
| 7,259,990 B2 | * | 8/2007 | Maejima et al. | 365/185.17 |
| 7,656,711 B2 | | 2/2010 | Shibata et al. | |
| 2011/0032771 A1 | * | 2/2011 | Lin | 365/185.25 |

FOREIGN PATENT DOCUMENTS

| | | |
|---|---|---|
| JP | 2-287845 | 11/1990 |
| JP | 10-228415 | 8/1998 |
| JP | 2004-146812 | 5/2004 |
| JP | 2007-30789 | 2/2007 |
| JP | 2008-197807 | 8/2008 |

* cited by examiner

*Primary Examiner* — Tuan T. Nguyen
(74) *Attorney, Agent, or Firm* — Oblon, Spivak, McClelland, Maier & Neustadt, L.L.P.

(57) ABSTRACT

According to one embodiment, a semiconductor memory system includes a first semiconductor memory device, a second semiconductor memory device, and a wiring line. The wiring line is connected between the first semiconductor memory device and the second semiconductor memory device. When one of the first and second semiconductor memory devices discharges electric charge, the other of the first and second semiconductor memory devices receives the discharged electric charge through the wiring line.

13 Claims, 28 Drawing Sheets

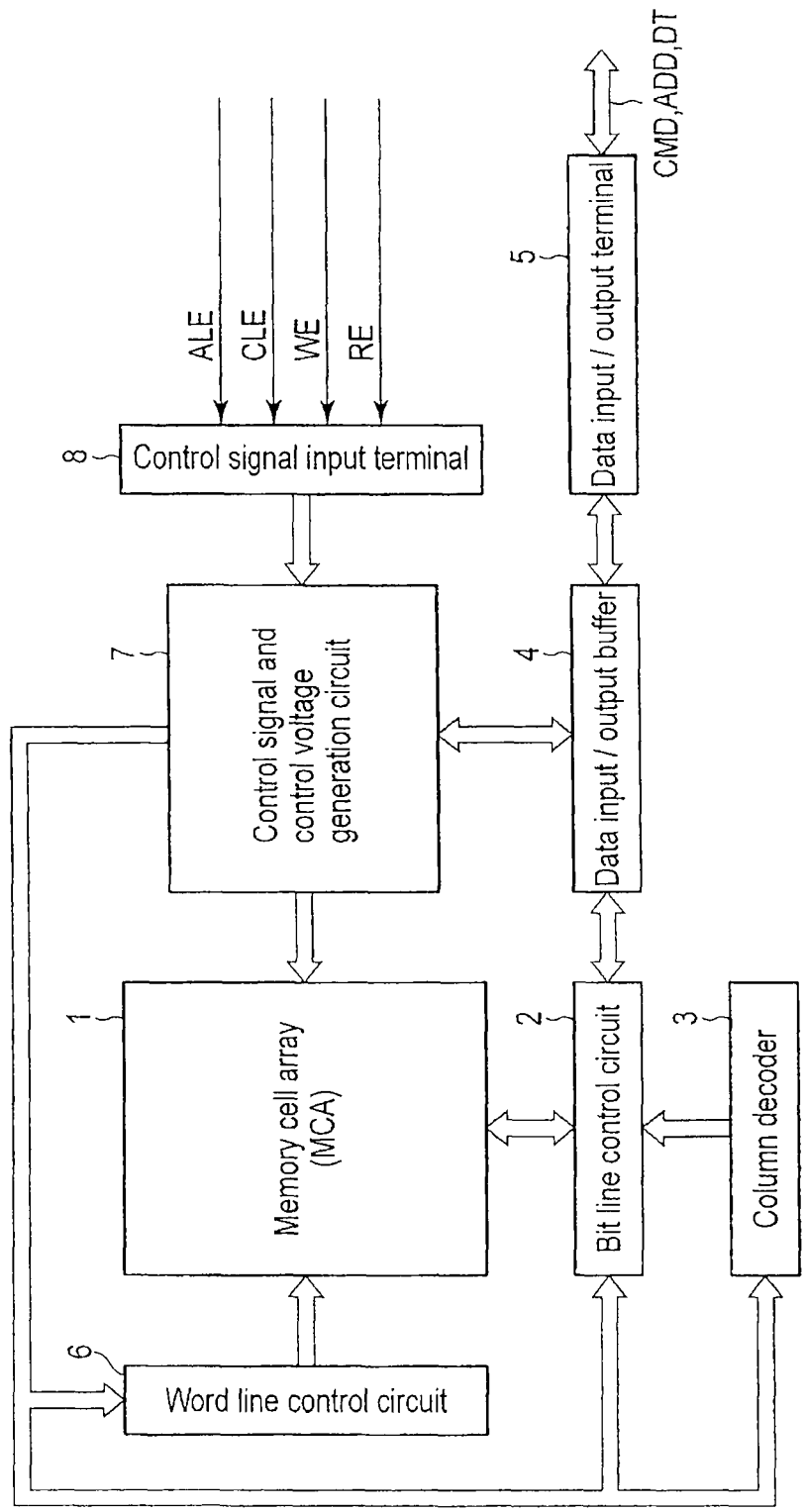
F I G. 1

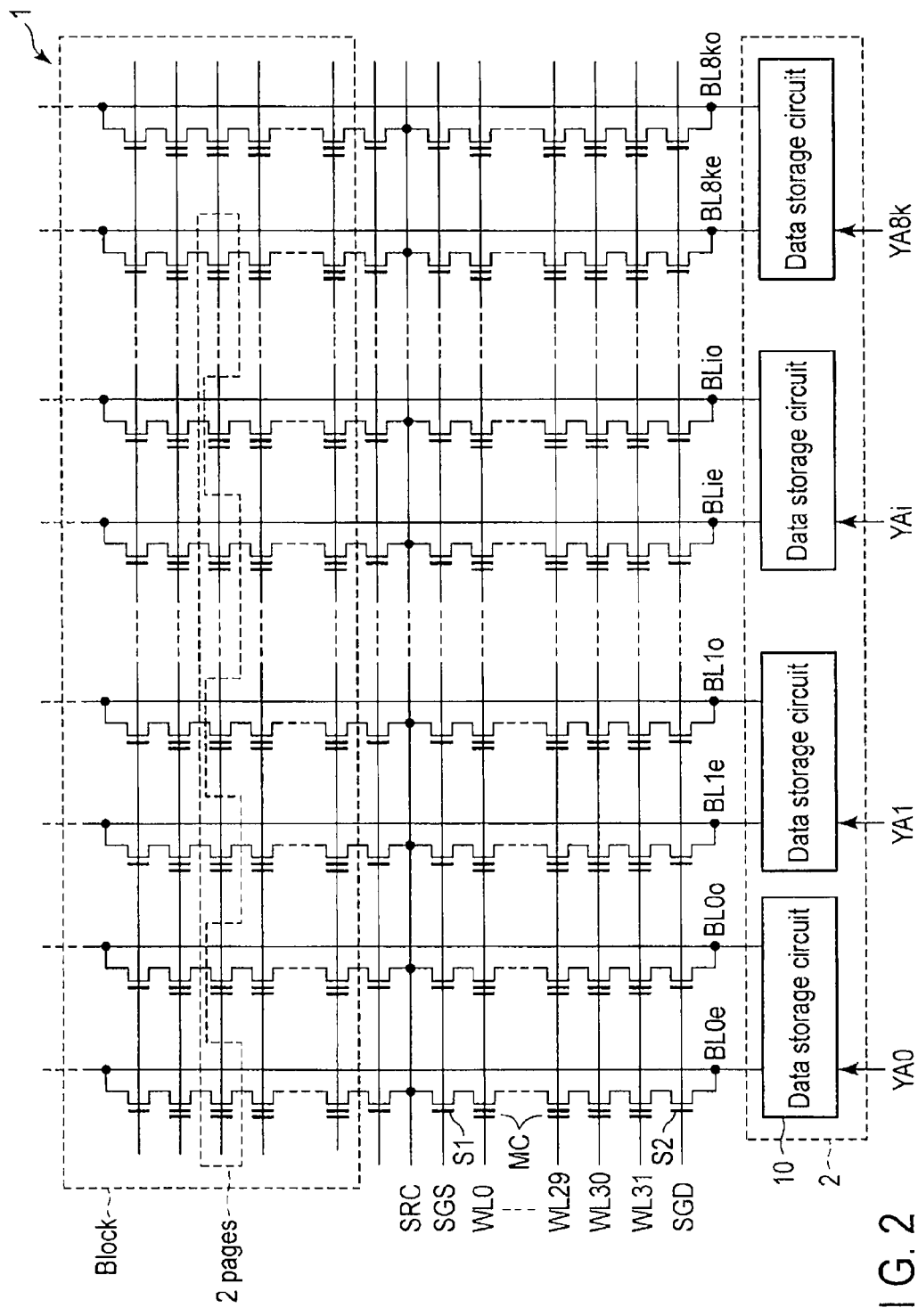
F I G. 2

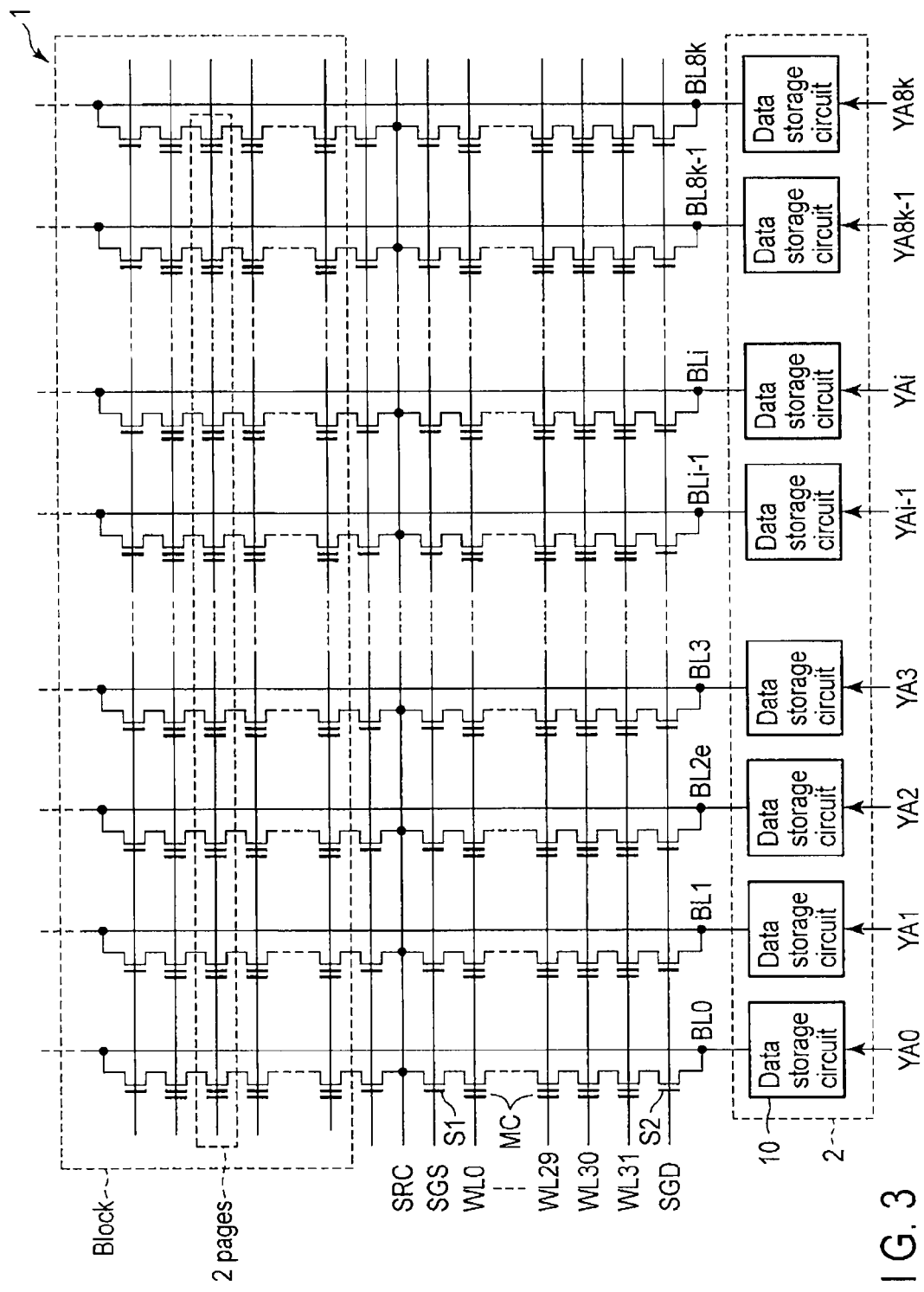
F I G. 3

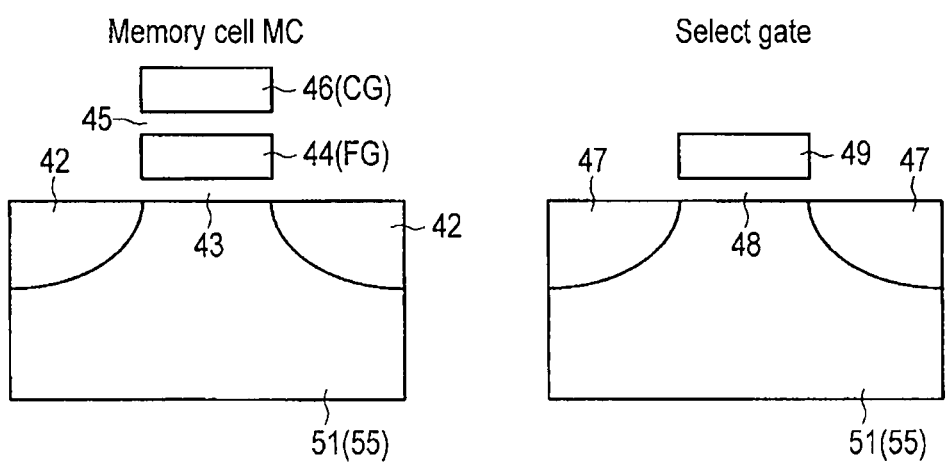
F I G. 4 A                F I G. 4 B

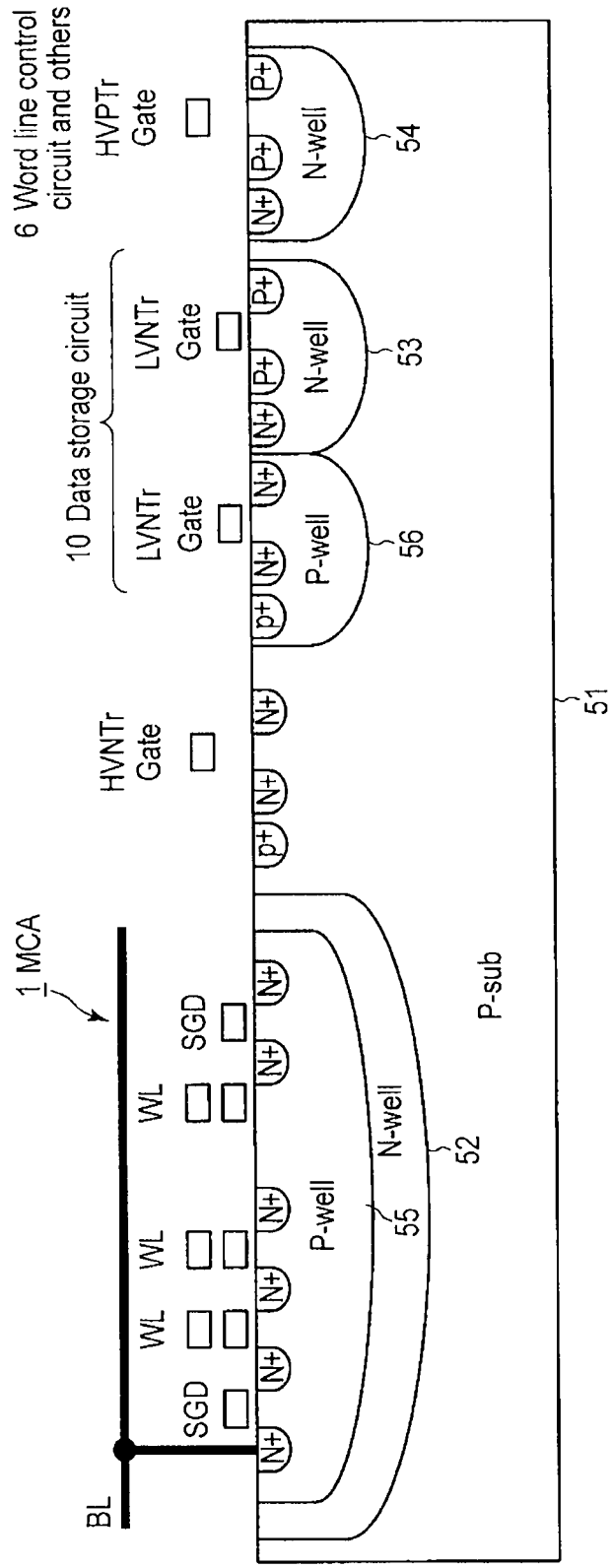
F I G. 5

| | Cell (P-Well) | Cell (N-Well) | H.V.Tr (P-sub) | L.V.Nch (P-Well) | L.V.Pch (N-Well) | H.V.Pch (N-Well) |
|---|---|---|---|---|---|---|
| Erase | Vera(20V) | Vera(20V) | Vss(0V) | Vss(0V) | Vdd(2.5V) | Vdd(2.5V) |
| Program | Vss(0V) | Vss(0V) | Vss(0V) | Vss(0V) | Vdd(2.5V) | Vdd(2.5V) / Vpgmh |
| Read | Vss(0V) | Vss(0V) | Vss(0V) | Vss(0V) | Vdd(2.5V) | Vdd(2.5V) / Vread |

F I G. 6

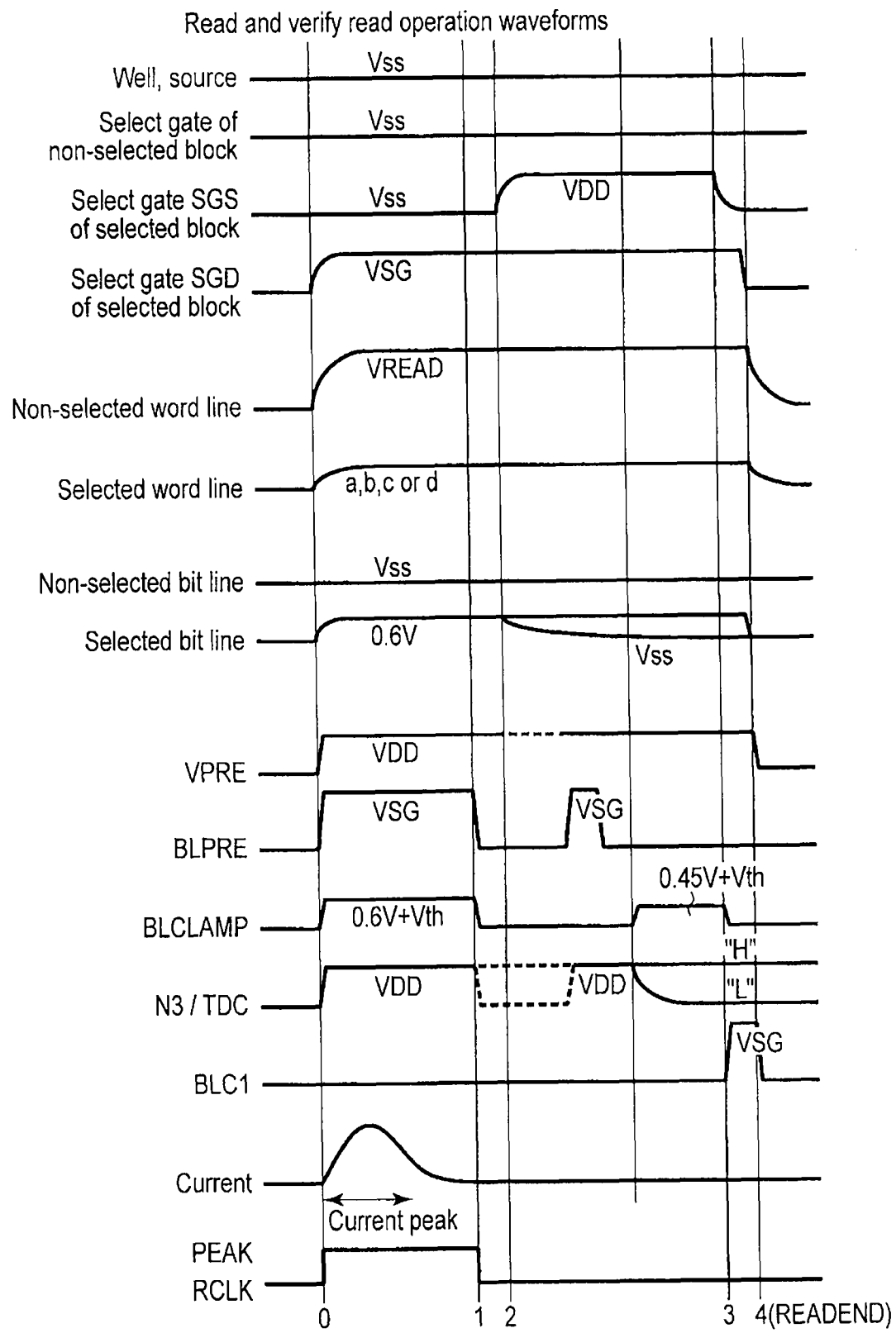
F I G. 9

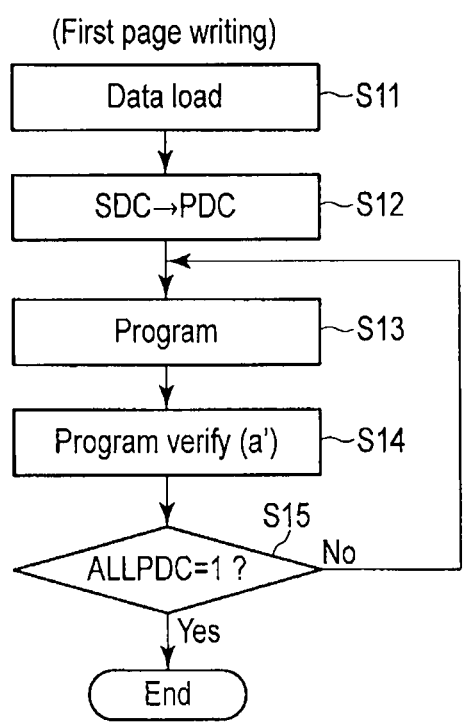
F I G. 1 1

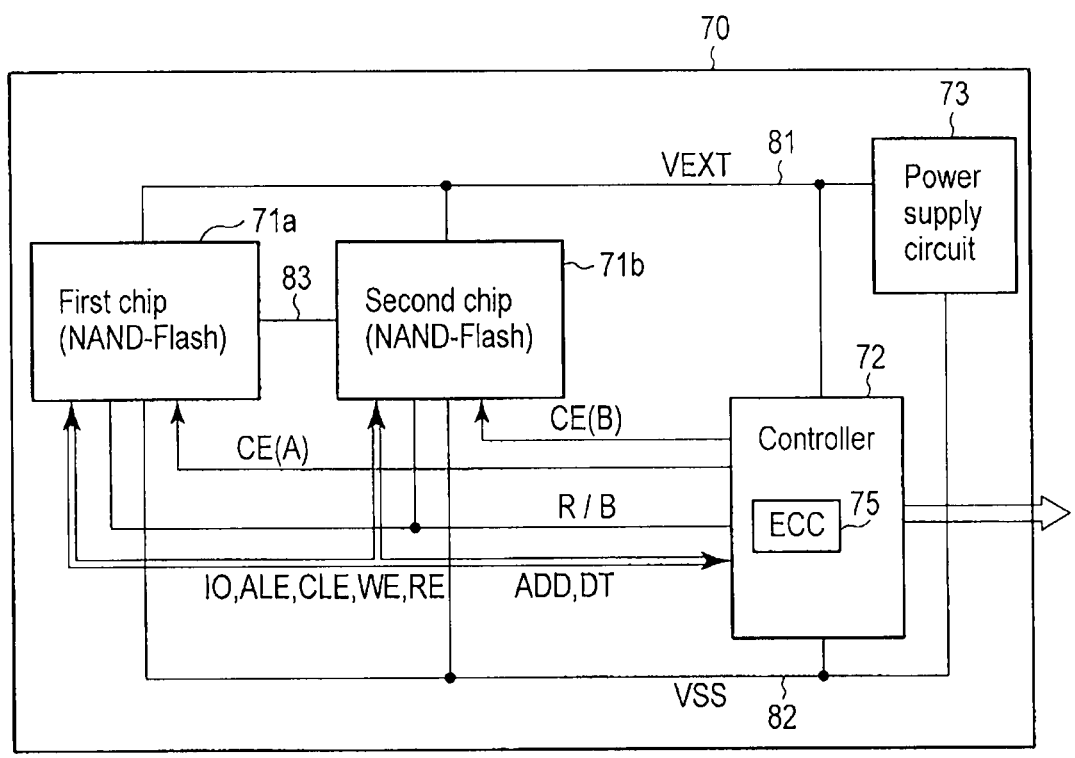
F I G. 13

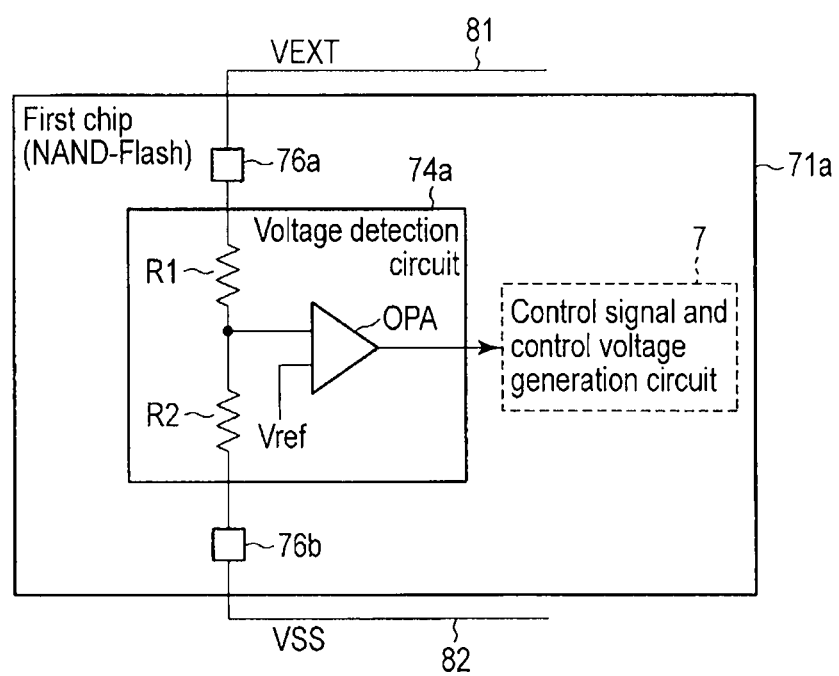
F I G. 18

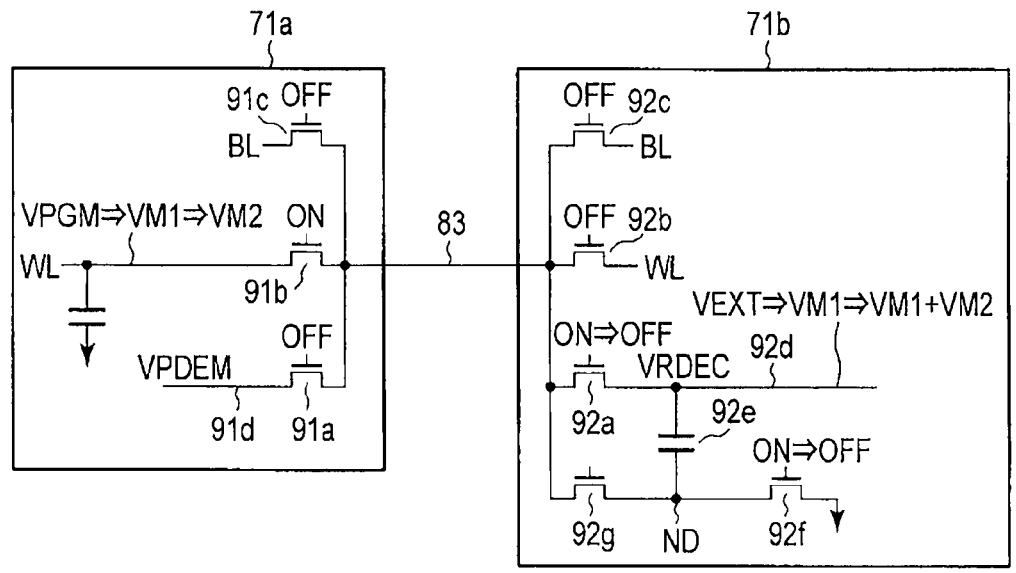
F I G. 1 9
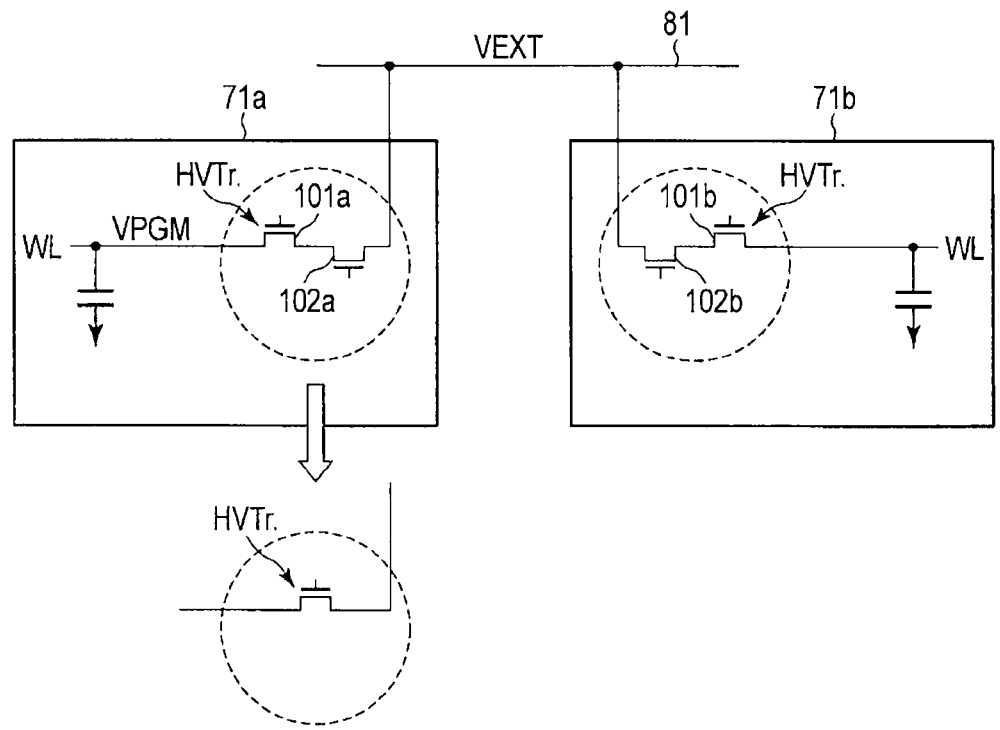
F I G. 2 0

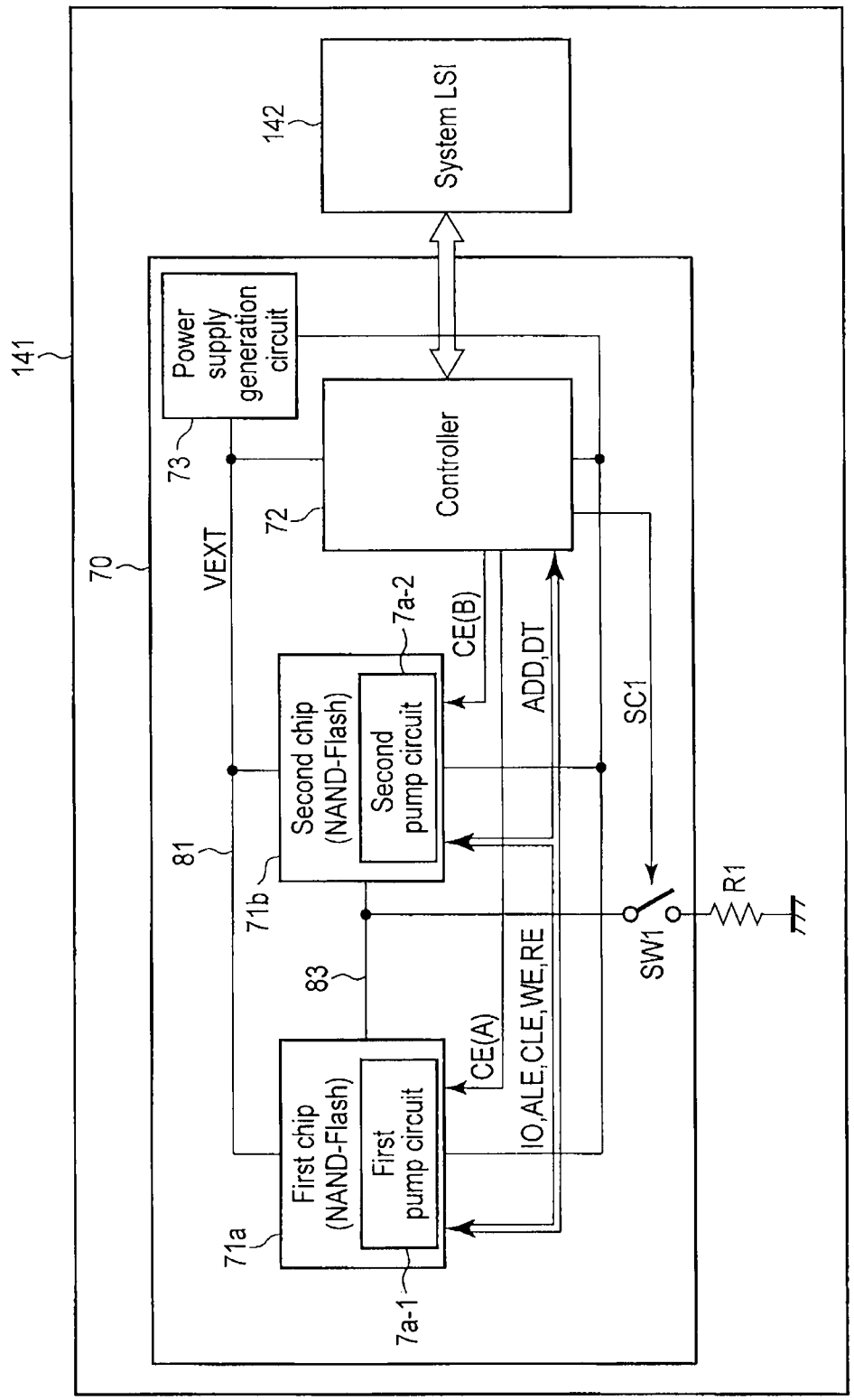
F I G. 27

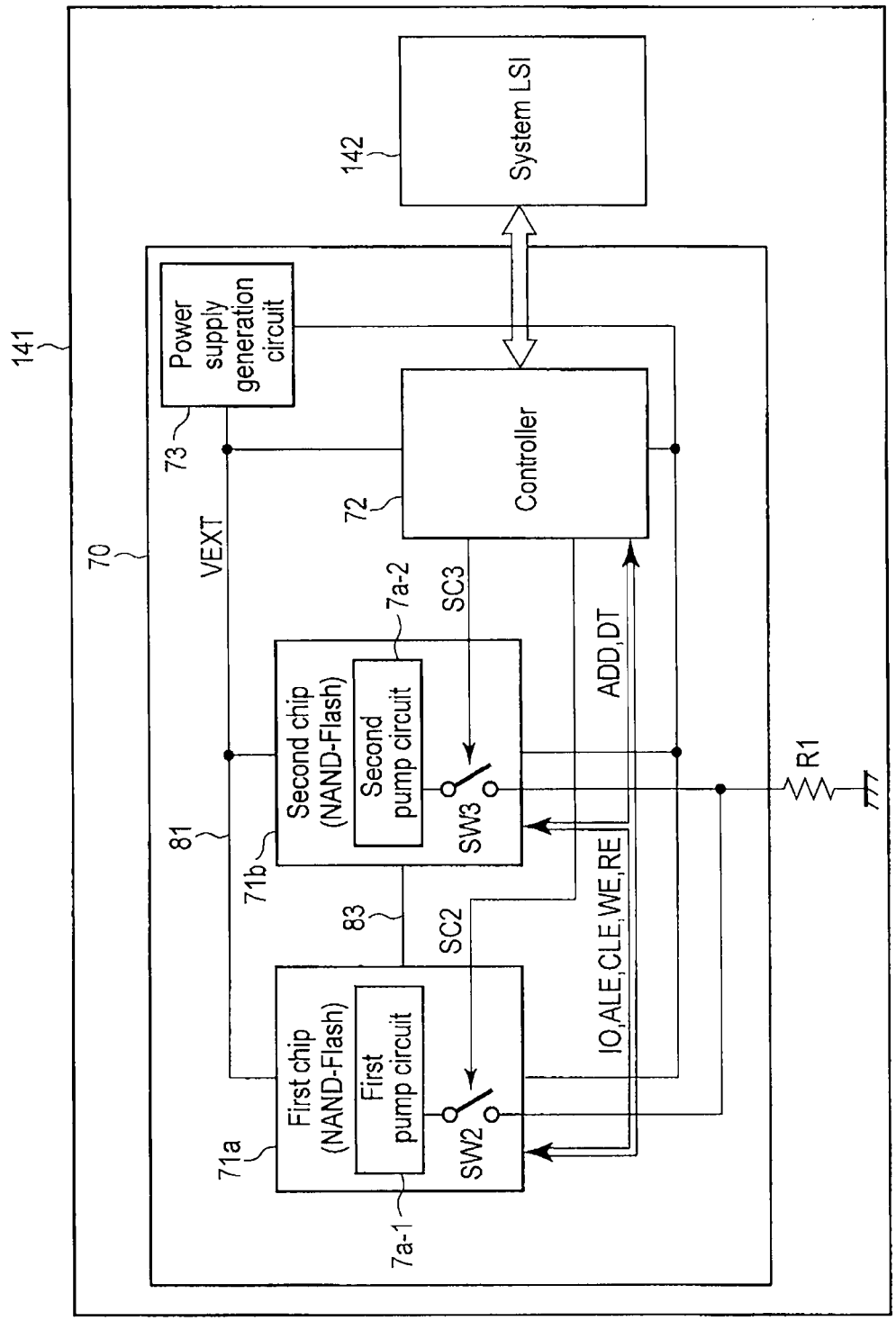
F I G. 29

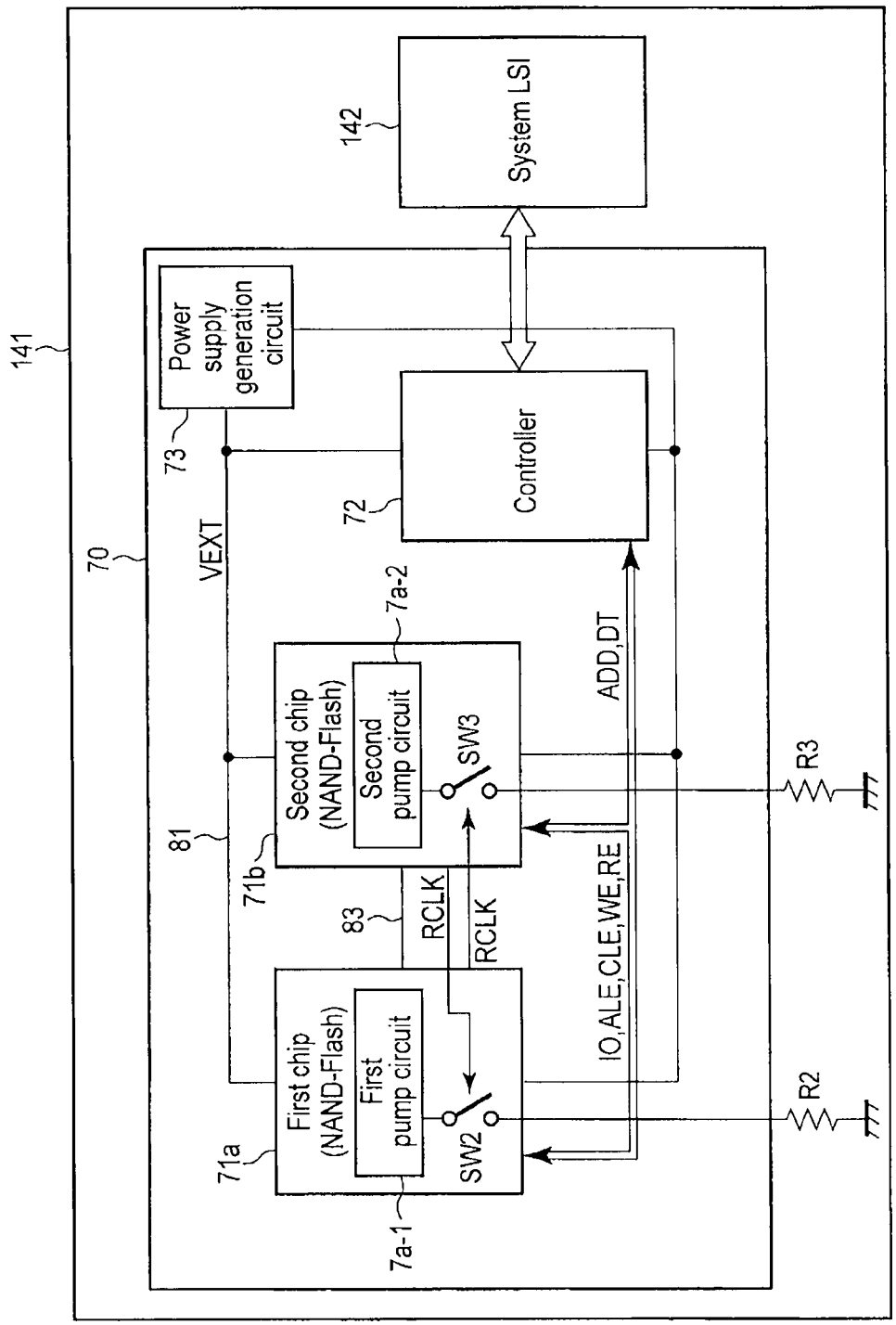
F I G. 30

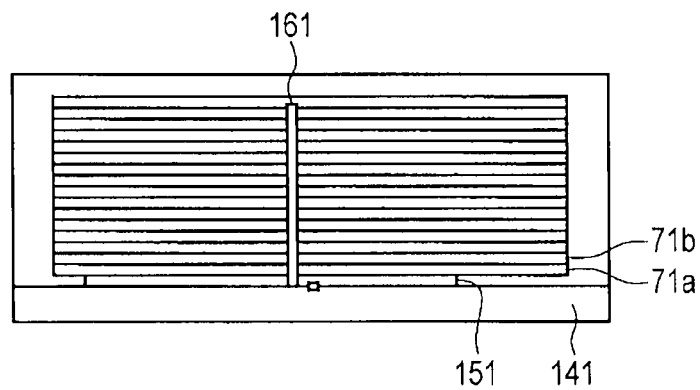
F I G. 3 1
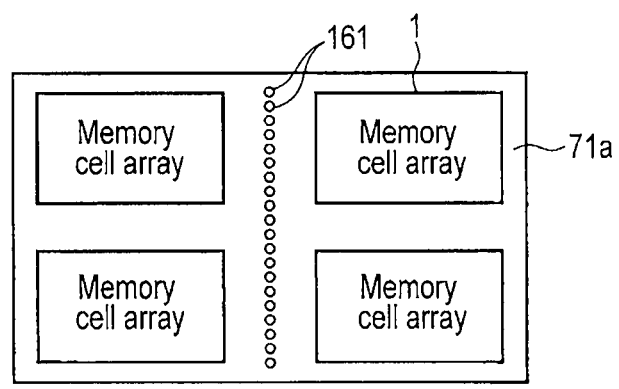
F I G. 3 2

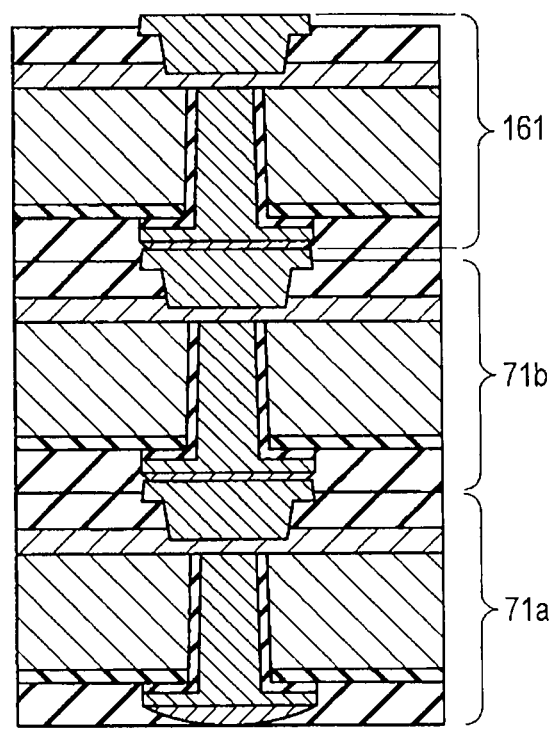
F I G. 3 3

SEMICONDUCTOR MEMORY SYSTEM CAPABLE OF SUPPRESSING CONSUMPTION CURRENT

CROSS-REFERENCE TO RELATED APPLICATIONS

This application is based upon and claims the benefit of priority from prior Japanese Patent Applications No. 2011-028662, filed Feb. 14, 2011; and No. 2011-260838, filed Nov. 29, 2011, the entire contents of all of which are incorporated herein by reference.

FIELD

Embodiments described herein relate generally to, e.g., a nonvolatile semiconductor memory apparatus such as a NAND flash memory, and more particularly to a semiconductor memory system in which a plurality of flash memories are mounted.

BACKGROUND

In a NAND flash memory, all bit lines must be charged at the beginning of a program operation, and all the bit lines must be likewise charged and currents flowing through all the bit lines must be judged at the beginning of a verify operation. Therefore, a very large current is required, and a large peak current is temporarily generated.

Further, the NAND flash memory is often used as a multi-chip package (MCP) in which a plurality of, e.g., two to four chips are mounted at the same time or a memory card in which a plurality of chips are mounted in order to increase a memory capacity. In case that the plurality of chips are mounted in this manner, when peak currents in the respective chips overlap, a larger peak current is generated, and a consumption current is increased.

BRIEF DESCRIPTION OF THE DRAWINGS

FIG. 1 is a block diagram schematically showing an example of a NAND flash memory applied to this embodiment;
FIG. 2 is a circuit diagram schematically showing a part of the configuration depicted in FIG. 1;
FIG. 3 is a circuit diagram schematically showing a part of the configuration depicted in FIG. 1 as an example different from that in FIG. 2;
FIGS. 4A and 4B are cross-sectional views showing a memory cell and a selection transistor;
FIG. 5 is a cross-sectional view showing a NAND flash memory;
FIG. 6 is a view showing an example of voltages supplied to respective regions depicted in FIG. 5;
FIG. 9 is a waveform chart showing a read or verify read operation;
FIG. 11 is a flowchart showing a program operation for a first page;
FIG. 13 is a block diagram schematically showing an example of a semiconductor memory system according to a first embodiment;
FIG. 18 is a circuit diagram showing an example of a voltage detection circuit;
FIG. 19 is a circuit diagram showing a second embodiment;
FIG. 20 is a circuit diagram showing a third embodiment;
FIG. 27 is a block diagram showing a fifth embodiment;
FIG. 29 is a block diagram showing a sixth embodiment;
FIG. 30 is a block diagram showing a seventh embodiment;
FIG. 31 is a cross-sectional view showing an example of a through silicon via;
FIG. 32 is a plan view showing an example of the through silicon vias;
and
FIG. 33 is a cross-sectional view showing an example of the through silicon via.

DETAILED DESCRIPTION

Figure 7:
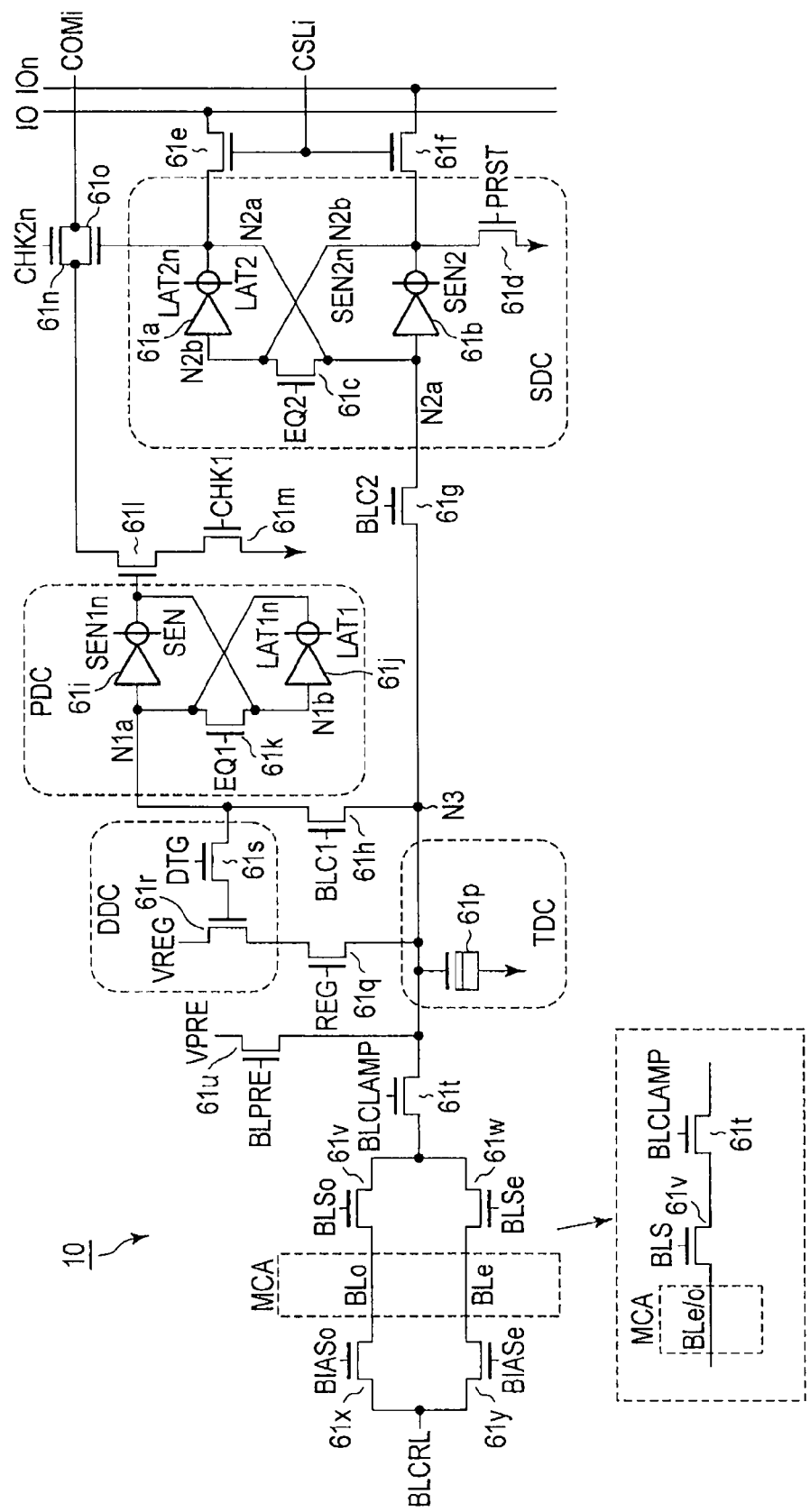
FIG. 7 is a circuit diagram showing an example of a data storage circuit depicted in FIG. 2 and FIG. 3.

In general, according to one embodiment, a semiconductor memory system includes a first semiconductor memory device, a second semiconductor memory device, and a wiring line. The wiring line is connected between the first semiconductor memory device and the second semiconductor memory device. When one of the first and second semiconductor memory devices discharges electric charge, the other of the first and second semiconductor memory devices receives the discharged electric charge through the wiring line.

An embodiment will now be described hereinafter with reference to the accompanying drawings.

A configuration and an operation of one NAND flash memory applied to this embodiment will be first explained with reference to FIG. 1 to FIG. 12.

FIG. 1 shows an outline configuration of a NAND flash memory that stores, e.g., 2-bit or 4-level data.

A memory cell array 1 includes a plurality of bit lines, a plurality of word lines, and a common source line, and memory cells formed of, e.g., EEPROM cells in which data can be electrically rewritten are arranged in a matrix form. A bit line control circuit 2 configured to control the bit lines and a word line control circuit 6 are connected to this memory cell array 1.

The bit line control circuit 2 reads out data in the memory cells in the memory cell array 1 through the bit lines, detects states of the memory cells in the memory cell array 1 through the bit lines, or applies a write control voltage to the memory cells in the memory cell array 1 through the bit lines to write data into the memory cells. To the bit line control circuit 2 are connected a column decoder 3 and a data input/output buffer 4. A data storage circuit in the bit line control circuit 2 is selected by the column decoder 3. Data in a memory cell read out to the data storage circuit is output to the outside from a data input/output terminal 5 through the data input/output buffer 4. Various kinds of commands CMD that are supplied from the outside and configured to control operations of the NAND flash memory, addresses ADD, and data DT are input to the data input/output terminal 5. Write data input to the data input/output terminal 5 is supplied to a data storage circuit selected by the column decoder 3 through the data input/output buffer 4, and a command and an address are supplied to a control signal and control voltage generation circuit 7 through the same.

The word line control circuit 6 is connected to the memory cell array 1. This word line control circuit 6 selects a word line in the memory cell array 1 and applies a voltage required for a read, write, or erase operation to the selected word line.

The memory cell array 1, the bit line control circuit 2, the column decoder 3, the data input/output buffer 4, and the word line control circuit 6 are connected to the control signal and control voltage generation circuit 7 and controlled by this control signal and control voltage generation circuit 7. The control signal and control voltage generation circuit 7 is connected to a control signal input terminal 8 and controlled by control signals ALE (address latch enable), CLE (command latch enable), WE (write enable), and RW (read enable) input from the outside through the control signal input terminal 8.

The bit line control circuit 2, the column decoder 3, the word line control circuit 6, and the control signal and control voltage generation circuit 7 constitute a write circuit and a read circuit.

FIG. 2 shows an example of configurations the memory cell array 1 and the bit line control circuit 2 depicted in FIG. 1. A plurality of NAND cells are arranged in the memory cell array 1. One NAND cell is constituted of memory cells MC formed of, e.g., 32 EEPROMs connected in series and selection gates S1 and S2. The selection gate S2 is connected to a bit line BL0e, and the selection gate S1 is connected to a source line SRC. Control gates of the memory cells MC arranged in respective rows are connected to word lines WL0 to WL29, WL30, and WL31 in common. Further, the selection gates S2 are connected to a select line SGD in common, and the selection gates S1 are connected to a select line SGS in common.

The bit line control circuit 2 has a plurality of data storage circuits 10. Each data storage circuit 10 is connected with a pair of bit lines (BL0e, BL0o), (BL1e, BL1o) . . . (BLie, BLio), or (BL8ke, BL8ko).

As indicated by a broken line, the memory cell array 1 includes a plurality of blocks. Each block is constituted of the plurality of NADD cells, and data is erased in, e.g., blocks. Furthermore, an erase operation is carried out with respect to two bit lines connected to the data storage circuit 10 at the same time.

Moreover, the plurality of memory cells that are arranged every other bit line and connected to one word line (the memory cells in the range surrounded by the broken line) constitute one sector. Data is written or read in accordance with each sector. That is, a half of the plurality of memory cells arranged in the row direction are connected to corresponding bit lines. Therefore, the write or read operation is executed with respect to the half of the plurality of memory cells arranged in the row direction.

At the time of a read operation, a program verify operation, and a program operation, one of the two bit lines (BLie, BLio) connected to the data storage circuit 10 is selected in accordance with an address signal (YA0, YA1 . . . YAi . . . YA8k) supplied from the outside. Additionally, one word line is selected in accordance with an external address, and two pages indicated by a broken line are selected. Switching of the two pages is carried out by using an address.

FIG. 3 shows another example of the configurations of the memory cell array 1 and the bit line control circuit 2 depicted in FIG. 1. In the configurations shown in FIG. 2, the two bit lines (BLie, BLio) are connected to the data storage circuit 10. On the other hand, in the configurations depicted in FIG. 3, the data storage circuit 10 is connected to each bit line, and a plurality of memory cells arranged in the row direction are all connected to a corresponding bit line. Therefore, the write or read operation can be carried out with respect to all the memory cells arranged in the row direction.

It is to be noted that the following description can be applied to both the configuration shown in FIG. 2 and the configuration shown in FIG. 3, but an example using FIG. 2 will be explained.

FIGS. 4A and 4B are cross-sectional views of a memory cell and a selection transistor. FIG. 4A shows the memory cell. Respective n-type diffusion layers 42 as a source and a drain of the memory cell are formed in a substrate 51 (a later-described P-type well region 55). A floating gate (FG) 44 is formed above the P-type well region 55 via a gate insulating film 43, and a control gate (CG) 46 is formed above this floating gate 44 through an insulating film 45. FIG. 4B shows the selection gate. Respective n-type diffusion layers 47 as a source and a drain are formed in the P-type well region 55. A control gate 49 is formed above the P-type well region 55 through a gate insulating film 48.

FIG. 5 is a cross-sectional view of a NAND flash memory. For example, N-type well regions 52, 53, and 54 and a P-type well region 56 are formed in a P-type semiconductor substrate 51. A P-type well region 55 is formed in the N-type well region 52, and a memory cell Tr constituting the memory cell array 1 is formed in this P-type well region 55. Further, a low-voltage P-channel transistor LVPTr and a low-voltage N-channel transistor LVNTr constituting the data storage circuit 10 are formed in the N-type well region 53 and the P-type well region 56. A high-voltage N-channel transistor HVNTr that connects the bit lines to the data storage circuit 10 is formed in the substrate 51. Furthermore, a high-voltage P-channel transistor HVPTr constituting, e.g., a word line drive circuit is formed in the N-type well region 54. As shown in FIG. 5, each of the high-voltage transistors HVNTr and HVPTr has, e.g., a gate insulation film thicker than each of the low-voltage transistors LVNTr and LVPTr.

FIG. 6 shows an example of voltages supplied to the respective regions. In the erase, program, and read operations, such voltages as depicted in FIG. 6 are supplied to the respective regions. Here, Vera is a voltage applied to the substrate when erasing data, Vss is a ground voltage, Vdd is a power supply voltage, Vpgmh is a voltage Vpgm+Vth supplied to the word lines when writing data, and Vreadh is a voltage Vread+Vth supplied to the word lines when reading data.

FIG. 7 is a circuit diagram showing an example of the data storage circuit 10 depicted in FIG. 2.

This data storage circuit 10 has a primary data cache (PDC), a secondary data cache (SDC), a dynamic data cache (DDC), and a temporary data cache (TDC). The SDC, the PDC, and the DDC hold input data at the time of the write operation, hold read data at the time of the read operation, temporarily hold data at the time of the verify operation, and are used for operations of internal data when storing multi-level data. The TDC amplifies and temporarily holds data of each bit line when reading data and is used for operations of internal data when storing multilevel data.

The SDC is constituted of clocked inverter circuits 61a and 61b constituting a latch circuit and transistors 61c and 61d. The transistor 61c is connected between an input end of the clocked inverter circuit 61a and an input end of the clocked inverter circuit 61b. A signal EQ2 is supplied to a gate of this transistor 61c. The transistor 61d is connected between an output end of the clocked inverter circuit 61b and the ground. A signal PRST is supplied to a gate of this transistor 61d. A node N2a of the SDC is connected to an input/output data line 10 through a column selection transistor 61e, and a node N2b of the same is connected to an input/output data line IOn through a column selection transistor 61f. A column selection signal CSLi is supplied to gates of these transistors 61e and 61f. The node N2a of the SDC is connected to a node N1a of the PDC through transistors 61g and 61h. A signal BLC2 is supplied to a gate of the transistor 61g, and a signal BLC1 is supplied to a gate of the transistor 61h.

The PDC is constituted of clocked inverter circuits 61i and 61j and a transistor 61k. The transistor 61k is connected between an input end of the clocked inverter circuit 61i and an input end of the clocked inverter circuit 61j. A signal EQ1 is supplied to a gate of this transistor 61k. A node N1b of the PDC is connected to a gate of a transistor 61l. One end of a current path of this transistor 61l is grounded through a transistor 61m. A signal CHK1 is supplied to a gate of this transistor 61m. Further, the other end of the current path of the transistor 61l is connected to one end of a current path of transistors 61n and 61o constituting a transfer gate. A signal CHK2n is supplied to a gate of this transistor 61n. Furthermore, a gate of the transistor 61o is connected to an output end of the clocked inverter circuit 61a. A wiring line COMi is connected to the other end of the current path of the transistors 61n and 61o. This wiring line COMi is a wiring line common to all the data storage circuits 10, and a potential in the wiring line COMi is changed to a high level when a verify operation of all the data storage circuits 10 is completed. That is, as will be described later, when the verify operation is completed, the node N1b of the PDC is changed to a low level. When the signals CHK1 and CHK2n are changed to the high level in this state, the potential in the wiring line COMi is changed to the high level if the verify operation has been terminated.

Moreover, the TDC is constituted of, e.g., an MOS capacitor 61p. This capacitor 61p is connected between a connection node N3 of the transistors 61g and 61h and the ground. Additionally, the DDC is connected to the connection node N3 through a transistor 61q. A signal REG is supplied to a gate of the transistor 61q.

The DDC is constituted of transistors 61r and 61s. A signal VREG is supplied to one end of a current path of the transistor 61r, and the other end of this current path is connected to a current path of the transistor 61q. A gate of this transistor 61r is connected to the node N1a of the PDC through the transistor 61s. A signal DTG is supplied to a gate of this transistor 61s.

Further, one end of a current path of transistors 61t and 61t is connected to the connection node N3. A signal VPRE is supplied to the other end of the current path of the transistor 61u, and BLPRE is supplied to a gate of this transistor. A signal BLCLAMP is supplied to a gate of the transistor 61t. The other end of the current path of this transistor 61t is connected to one end of the bit line BLo through a transistor 61v and also connected to one end of the bit line BLe through a transistor 61w. The other end of the bit line BLo is connected to one end of a current path of a transistor 61x. A signal BIASo is supplied to a gate of this transistor 61x. The other end of the bit line BLe is connected to one end of a current path of a transistor 61y. A signal BIASe is supplied to a gate of this transistor 61y. A signal BLCRL is supplied to the other end of the current path of these transistors 61x and 61y. The transistors 61x and 61y are complementarily turned on with the transistors 61v and 61w in accordance with the signals BIASo and BIASe to supply a potential of the signal BLCRL to a non-selected bit line.

The respective signals and voltages are generated by the control signal and control voltage generation circuit 7 depicted in FIG. 7, and the following operations are controlled under control of this control signal and control voltage generation circuit 7.

Further, the configuration of the data storage circuit 10 shown in FIG. 3 is equal to that depicted in FIG. 7 but different in the connection with the bit lines alone. That is, as shown in FIG. 7, for example, the transistor 61v alone is connected to the other end portion of the transistor 61t, and the bit line BLe or BLo is connected through this transistor 61v.

This memory is a so-called multilevel memory and can store 2-bit data in 1 cell. 2 bits are switched by using an address (a first page, a second page). 2 pages are used in case of storing 2 bits in 1 cell, but an address (the first page, the second page, a third page) is utilized to perform switching in case of storing 3 bits in 1 cell. Further, in case of storing 4 bits in 1 cell, an address (the first page, the second page, the third page, a fourth page) is utilized to perform switching.

Figure 8A:
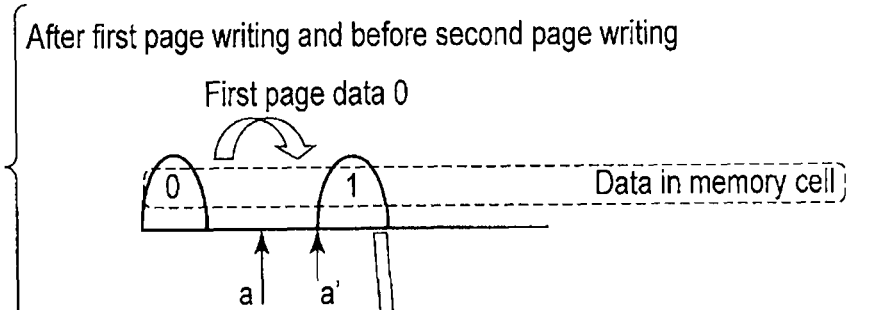
FIGS. 8A, 8B, and BC are views showing a relationship between data and a threshold voltage when storing 2-bit data in a memory cell.
Figure 8B:
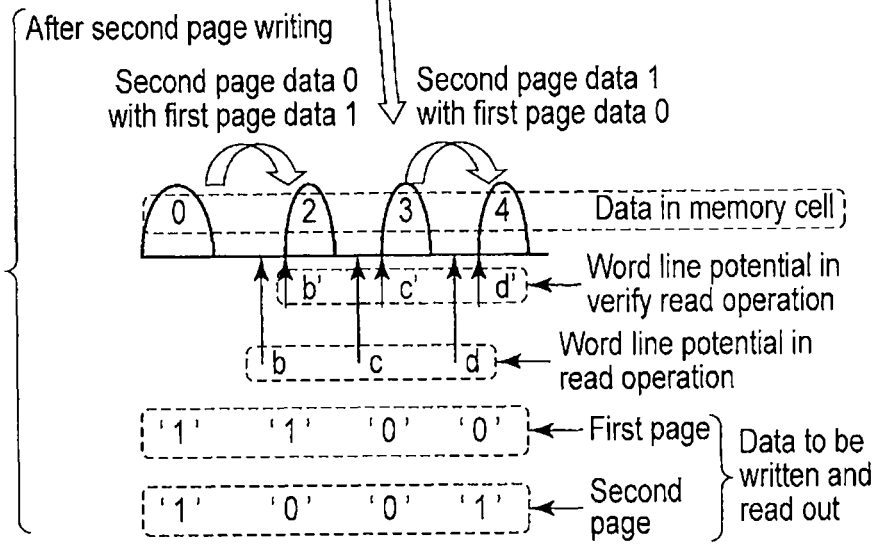
Figure 8C:
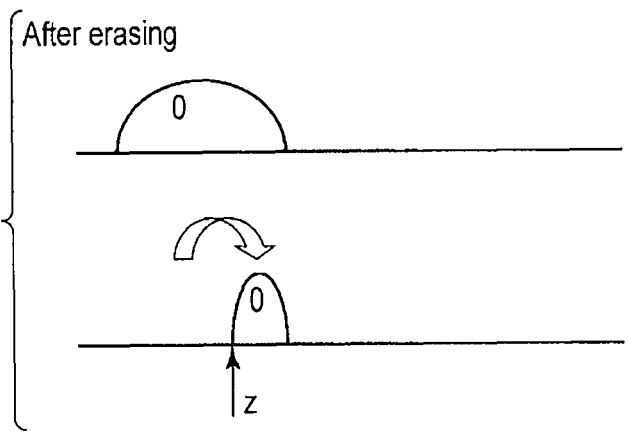

FIGS. 8A, 8B, and 8C show a relationship between data and a threshold voltage when storing 2-bit data in the memory cell. When the erase operation is carried out, data in the memory cell is "0" as shown in FIG. 8C. After the erase operation, to reduce the spread of a threshold distribution, a write operation is performed by using, e.g., a verify level "z". This data "0" is set to, e.g., a negative threshold voltage distribution.

As shown in FIG. 8A, in writing in the first page, data in the memory cell remains as "0" when write data is "1", and the data in the memory cell is "1" when the write data is "0".

As shown in FIG. 8B, after writing in the second page, the data in the memory cell is one of "0", "2", "3", and "4" in accordance with the write data. That is, the data in the memory cell remains as "0" when the data in the memory cell is "0" and write data in the second page is "1" after the writing in the first page, and the data in the memory cell is "2" when the write data is "0". Furthermore, the data in the memory cell is "3" when the data in the memory cell is "1" and the write data is "0" after the writing in the first page, and the data in the memory cell is "4" when the write data is "1". In this embodiment, the data in the memory cell is defined in accordance with ascension from a lower threshold voltage to a higher threshold voltage.

(Read Operation)

As shown in FIG. 8A, after the writing in the first page, since the data in the memory cell is preset as the data "0" or the data "1", the read operation is carried out at a level "a". Moreover, after the writing in the second page, the data in the memory cell is one of "0", "2", "3", and "4" as shown in FIG. 8B. Therefore, the read operation is performed with one of potentials "b", "c", and "d".

FIG. 9 shows waveforms of the read and verify read operations. In the read operation, first, a well, a source line, and a non-selected bit line of a selected cell are set to 0 V.

A potential "a" (e.g., "a"=0 V), "b", "c", or "d" in the read operation is supplied a selected word line. At the same time, Vread is set to each non-selected word line of a selected block, Vsg (=Vdd+Vth) is set to the select line SGD of the selected block, and Vss is set to the select line SGS. Vdd (e.g., 2.5 V) is temporarily supplied to VPRE, Vsg is temporarily supplied to BLPRE, and a voltage of, e.g., (0.6 V+Vth) is temporarily supplied to BLCLAMP in the data storage circuit depicted in FIG. 7, and the bit lines are precharged to, e.g., 0.6 V.

At this time, the selected bit line has 0.6 V, and the non-selected bit line has the Vss. Therefore, assuming that a capacity of each of one given selected bit line, non-selected bit lines, the wells, the sources, and others is, e.g., 4 pF, a capacity Q of one bit line is Q=C×V or Q=4 pF×0.6 V. Here, for example, when writing 8 kB at the same time, Q=8×1024×8×4 pF×0.6 V is achieved. Therefore, as shown in FIG. 9, a large peak current is generated.

Then, the source-side select line SGS of the cell is set to Vsg (=Vdd+Vth). When the threshold voltage is higher than the potential "a", "b", "c", or "d", since the cell is turned off, the bit line remains as the high level (e.g., 0.6 V). When the threshold voltage is lower than the potential "a", "b", "c", or "d", since the cell is turned on, the bit line is discharged to have the same potential as the source, i.e., Vss.

Subsequently, the signal BLARE of the data storage circuit depicted in FIG. 7 is temporarily set to Vsg (=Vdd+Vth), and the node of the TDC is precharged to Vdd. Thereafter, a voltage of, e.g., (0.45 V+Vth) is supplied to the signal BLCLAMP. The node of the TDC is changed to the low level when the voltage in the bit line is lower than 0.45 V, and it remains as the high level when the voltage in the bit line is higher than 0.45 V. Here, the signal BLC1 is set to Vsg (=Vdd+Vth), and a potential in the TDC is read to the PDC. Therefore, the PDC is set to the low level when the threshold voltage of the cell is lower than the level of the potential "a", "b", "c", or "d", and the PDC is set to the high level when the same is higher than the level of the potential "a", "b", "c", or "d", thereby carrying out the read operation.

As shown in FIG. 3, when collectively reading data in all the cells aligned in the row direction, the select line SGS of the selected block is changed to the high level simultaneously with the select line SGD of the selected block. Therefore, at the same time as charging the bit line, the bit line is discharged when each cell is in the ON stage, and the bit line is maintained in a charged state when the cell is in the OFF state. The level of the bit line is read into the PDC through the TDC. Therefore, when the number of the cells that are in the ON state is high, there occurs a problem that a large current flows to the source line from the node to which the signal VPRE is supplied and a potential in the source line increases. To suppress this state, when the read operation is carried out more than once and the cell is first turned on, i.e., the current flows through the cell even though the potential in the source line increases, a read result is determined as the low level, the bit line is not charged from the next operation, and the read operation is again performed with respect to the cell having a read result of the high level in the first read operation. Therefore, a large peak current is generated in the first read operation.

(Program and Program Verify)
(Program)

Figure 10:
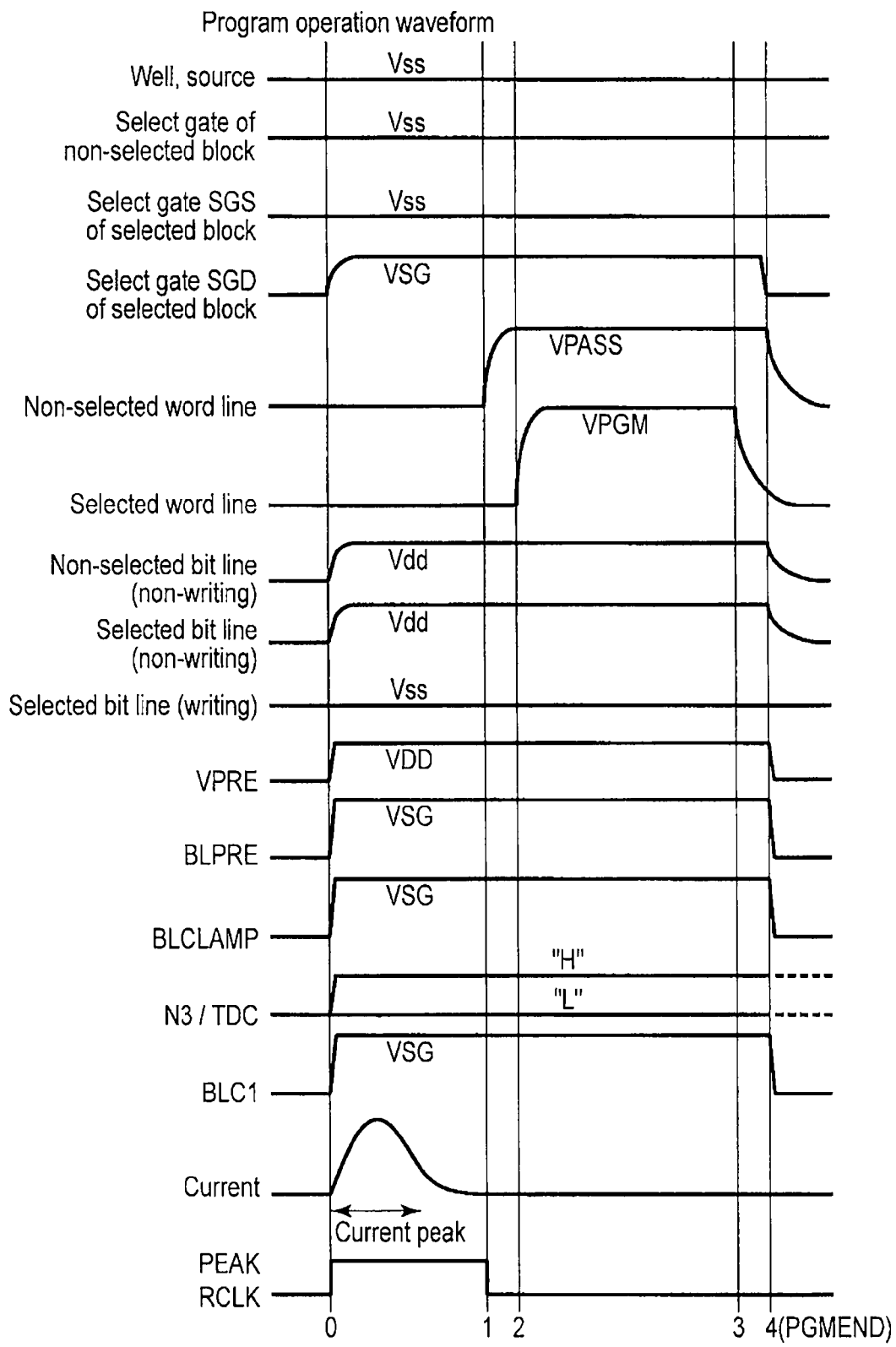
FIG. 10 is a waveform chart showing a program operation.
Figure 12:
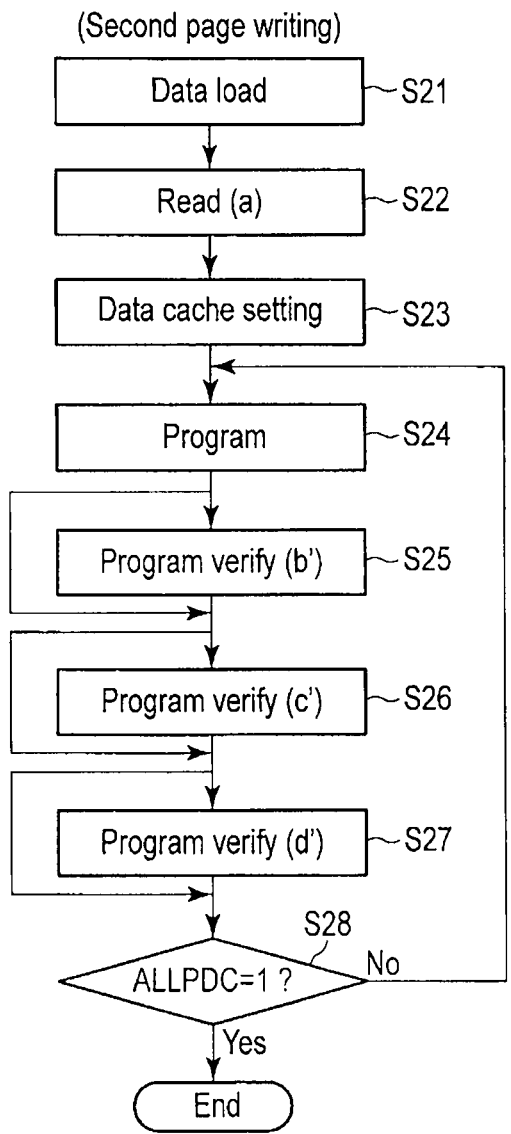
FIG. 12 is a flowchart showing a program operation for a second page.

FIG. 10 shows waveforms of the program operation, FIG. 11 shows the program operation for a first page, and FIG. 12 shows the program operation for a second page.

In the program operation, an address is first specified, and 2 pages shown in FIG. 2 are selected. This memory can program the first page and the second page in the 2 pages in the mentioned order only. Therefore, the first page is selected by using the address.

Then, write data is input from the outside and stored in the SDCs in all the data storage circuits 10 (a step S11). When a write command is input, the data in the SDCs in all the data storage circuits 10 is transferred to the PDCs (a step S12). The node N1a of each PDC is changed to the high level when data "1" (the write operation is not performed) is input from the outside, and the same is changed to the low level when data "0" (the write operation is performed) is input. Thereafter, the data in the PDC is determined as a potential at N1a of the data storage circuit 10, and the data in the SDC is determined as a potential at N2a in the data storage circuit 10.

(Program Operation) (S13)

If the signal BLC1 of the data storage circuit 10 shown in FIG. 7 is set to Vdd+Vth, the bit line has Vdd when the data "1" (the write operation is not performed) is stored in the PDC, and the bit line has Vss when the data "0" (the write operation is performed) is stored in the same. Further, since no data must be written into cells of a non-selected page (the bit lines are not selected) connected to a selected word line, the bit lines connected to these cells are also set to Vdd.

At this time, since the non-selected bit lines are in the non-write mode (Vdd) when the selected bit line is in the write mode (Vss), if a capacity of the one selected bit line, the non-selected bit lines, the well, the source, and others is, e.g., 4 pF, an electric charge Q of the one bit line is Q=C (4 pF)×V (2.5 V). Here, when simultaneously writing data in the memory cells having a capacity of, e.g., 8 kB, Q (8 kB)=8×1024×8×C (4 pF)×V (2.5 V) is achieved, and a large peak current is generated.

Further, as shown in FIG. 3, when collectively writing data in all the memory cells aligned in the row direction, all the bit lines are in the selected state. In particular, when the data "1" and the data "0" are alternately aligned in the write data, all the bit lines have a maximum capacity, and a large peak current is generated.

Here, when Vdd is supplied to the select line SGD in a selected block, a write voltage (20 V) is supplied to a selected word line, VPASS (10 V) is supplied to non-selected word lines, and the bit lines has Vss, a channel of each memory cell has Vss, the word line of the same has VPGM, and the write operation is not performed. On the other hand, when the bit lines has Vdd, the channel of each cell has Vdd instead of Vss, and the channel of each memory cell has approximately VPGM/2 due to coupling, whereby no data is written into each memory cell.

In the write operation of the first page, the data in each memory cell has the data "0" and the data "1". After the write operation of the second page, the data in each memory cell has data "0", "2", "3", and "4".

(S21 to S24)
(Program Verify Read) (S14, S25 to S27).

Since data is written into each memory cell at a level of a low threshold voltage, the program verify operation of the first page is performed by using a potential "a'", and the verify operation of the second page is performed by using a potential "b'", "c'", or "d'". The program verify operation is substantially equal to the read operation.

First, the well, the source line, and the non-selected bit lines of the selected memory cell are set to Vss. The potential "a'", "b'", "c'", or "d'" slightly higher than the potential "a" at the time of the read operation is supplied to the selected bit line (for example, if "a"=0 V, "a'"=0.5 V), and "'" will represent a verify potential and has a value slightly higher than the read potential hereinafter.

The signal VPRE is set to Vdd (e.g., 2.5 V), the signal BLPRE is set to Vsg (=Vdd+Vth), and the signal BLCLAMP is set to, e.g., (0.6 V+Vth) in the data storage circuit 10 depicted in FIG. 7, and the bit lines are precharged to 0.6 V. Then, the select line SGS of the cells on the source side is set to Vsg (=Vdd+Vth). The well and the source line have the voltage Vss. Therefore, when the threshold voltage is higher than the verify potential "a'", "b'", "c'", or "d'", since each cell is turned off, the bit lines remain on the high level (e.g., 2.2 V). When the threshold voltage is lower than the verify potential "a'", "b'", "c'", or "d'", since each cell is turned on, the bit lines are discharged to have Vss. During this discharge period of the bit lines, the signal VPRE is set to Vss, the signal BLPRE is set to Vdd, the TDC is set to Vss, the signal REG is set to the high level, and the signal VREG is set to the high level to move data in the DDC to the TDC. Then, the signal DTG is temporarily set to Vsg (=Vdd+Vth) to copy the data in the PDC to the DCC. Subsequently, the signal BLC1 is set to the high level to move the data in the TDC to the PDC. Based on this operation, the data that represents the write operation or the non-write operation and is stored in the PDC is moved to the DDC, and the data in the DDC is transferred to the PDC.

Subsequently, the signal BLPRE is temporarily set to Vsg (=Vdd+Vth), and the node N3 of the TDC is precharged to have Vdd. Then, the signal BLCLAMP is set to, e.g., (0.45 V+Vth). The node N3 of the TDC is changed to the low level when each bit line is lower than 0.45 V, and the node N3 remains at the high level when each bit line is higher than 0.45 V. Here, the signal BLC1 is set to Vsg (=Vdd+Vth), and the potential in the TDC is read into the PDC. Subsequently, the signal VREG is set to Vdd, the signal REG is set to Vsg (=Vdd+Vth), and the TDC is forcibly changed to the high level when the DDC is at the high level (the non-write operation). However, when the DDC is at the low level (the write operation), a value of the TDC is not changed. Here, the signal DTG is set to Vsg (=Vdd+Vth), the data in the PDC is transferred to the DDC, then the signal BLC1 is set to Vsg(=Vdd+ Vth), and the potential in the TDC is read into the PDC. Therefore, when the PDC is at the low level (the write operation) from the beginning and the threshold voltage in each cell is lower than the verify potential "a'", "b'", "c'", or "d'", the PDC is again set to the low level (the write operation). Further, when the threshold voltage of each cell is higher than the verify potential "a'", "b'", "c'", or "d'", the PDC is changed to the high level, and the non-write mode starts from the next program. Furthermore, when the PDC is at the high level (the non-write operation) from the beginning, the PDC is set to the high level, and the non-write mode starts from the next program.

Moreover, with respect to the write operation for the second page, in the program verify operation using the verify potential "b", no data is written in each cell in which memory cell data "3" or "4" is to be written in the program verify operation using the verify potential "b" when the above-described operation is carried out. Therefore, for example, in case of writing the memory cell data "3" or "4", the node N2a of the data storage circuit 10 shown in FIG. 7 is set to the low level. In case of writing the memory cell data "2", the node N2a is set to the high level. In this state, the signal REG is set to Vsg. In case of the non-write mode, before an operation of forcibly changing the TDC to the high level, the signal BLC2 is set to Vtr(=0.1 V+Vth). In case of writing the memory cell data "3" or "4", the TDC is forcibly changed to the low level in advance so that the write operation is not terminated in the program verify operation using the verify potential "b'".

Additionally, with regard to the write operation for the second page, in the program verify operation using the verify potential "c'", each cell in which the memory cell data "4" is to be written enters the non-write mode in the program verify operation using the verify potential "c'" when the above-described operation is carried out. Therefore, for example, in case of writing the memory cell data "3", the data in the DDC of the data storage circuit 10 shown in FIG. 7 is set to the low level in advance. Since the data in the PDC and the data in the DDC are counterchanged during discharge of each bit line, the signal BLC1 is set to Vtr(=0.1V+Vth) before the operation of forcibly changing the TDC to the high level. In case of writing the memory cell data "4", the TDC is forcibly set to the low level so that the write operation is not terminated in the program verify operation using the verify potential "d'".

When the PDC is at the low level, the write operation is again performed, and this program operation and the verify operation are repeated until data in the PDCs of all the data storage circuits 10 is changed to the high level (S15 to S13, S28 to S24).

Further, as shown in FIG. 3, when collectively performing the program verify operation with respect to all the memory cells aligned in the row direction, pieces of data are read out from the memory cells and the program verify operation is performed like the example where pieces of data in all the memory cells aligned in the row direction are collectively read out.

(Erase Operation)

The erase operation is carried out in units of block indicated by broken lines in FIG. 2 and FIG. 3. After the erase operation, the threshold voltage of each cell becomes equal to that in case of the data "0" in each memory cell as shown in FIG. 8C.

First Embodiment

FIG. 13 schematically shows, e.g., an MCP (a multichip package) 70 according to a first embodiment. However, the first embodiment can be applied to not only the MCP but a memory card.

In FIG. 13, the MCP 70 includes first and second semiconductor chips (which will be simply referred to as chips hereinafter) 71a and 71b. Each of the first and second chips 71a and 71b includes a NAND flash memory as a semiconductor memory device having the above-described configuration. FIG. 13 shows an example that the two NAND flash memory chips are mounted, but more chips may be mounted.

A controller 72 is connected to the first and second chips 71a and 71b and supplies chip enable signals CE(A) and CE(b), a signal R/B indicative of ready/busy, the address latch enable signal ALE, a command latch enable signal CLE, a write enable signal WE, a read enable signal RE, an address signal ADD, data DT and others to the first and second chips 71a and 71b, thereby controlling writing and reading data with respect to the first and second chips 71a and 71b. It is to be noted that a common chip enable signal CE may be supplied to the first and second chips 71a and 71b instead of the chip enable signals CE(A) and CE(B) to perform selecting and non-selecting operations of the first and second chips 71a and 71b by using an address.

Furthermore, the controller 72 receives data read out from the first and second chips 71a and 71b and outputs the received data to the outside. Moreover, the controller 72 includes an ECC (Error Checking and Correcting) circuit 75, adds parity data to write data at the time of wiring the data, and performs error detection and error correction at the time of reading the data.

Additionally, a power supply voltage VEXT and a ground voltage VSS are supplied to the first and second chips 71a and 71b and the controller 72 from a power supply circuit 73. That is, the power supply circuit 73, the first and second chips 71a and 71b, and the controller 72 are connected through power supply lines 81 and 82, and the power supply voltage VEXT and the ground voltage VSS are supplied to the first and second chips 71a and 71b and the controller 72 via the power supply lines 81 and 82.

Further, the first and second chips 71a and 71b are connected to each other through a wiring line 83, and electric charge can be transferred between the first and second chips 71a and 71b as will be described later. For example, the wiring line 83 is a metal wire made of gold or copper. Furthermore, for example, the wiring line 83 is connected by using metal wires through external terminals (bonding pads) of the first and second chips 71a and 71b.

It is to be noted that the power supply circuit 73 may be provided in the controller 72. Moreover the controller 72 and the power supply circuit 73 may be provided outside the MCP 70.

Meanwhile, in the operations, e.g., the program operation, the program verify operation, the read operation, the erase operation, the erase verify operation, and others of the NAND flash memory, each bit line is charged, each word line is set to a high voltage, or a high voltage is applied to a gate of a transistor that selects a word line as described above. These voltages are not reused since electric charge is discharged to a lower potential, e.g., the ground.

Thus, in the first embodiment, as described above, the wiring line 83 that connects the first chip 71a and the second chip 71b to each other is provided to enable reuse of electric charge of the first and second chips 71a and 71b.

Figure 14:
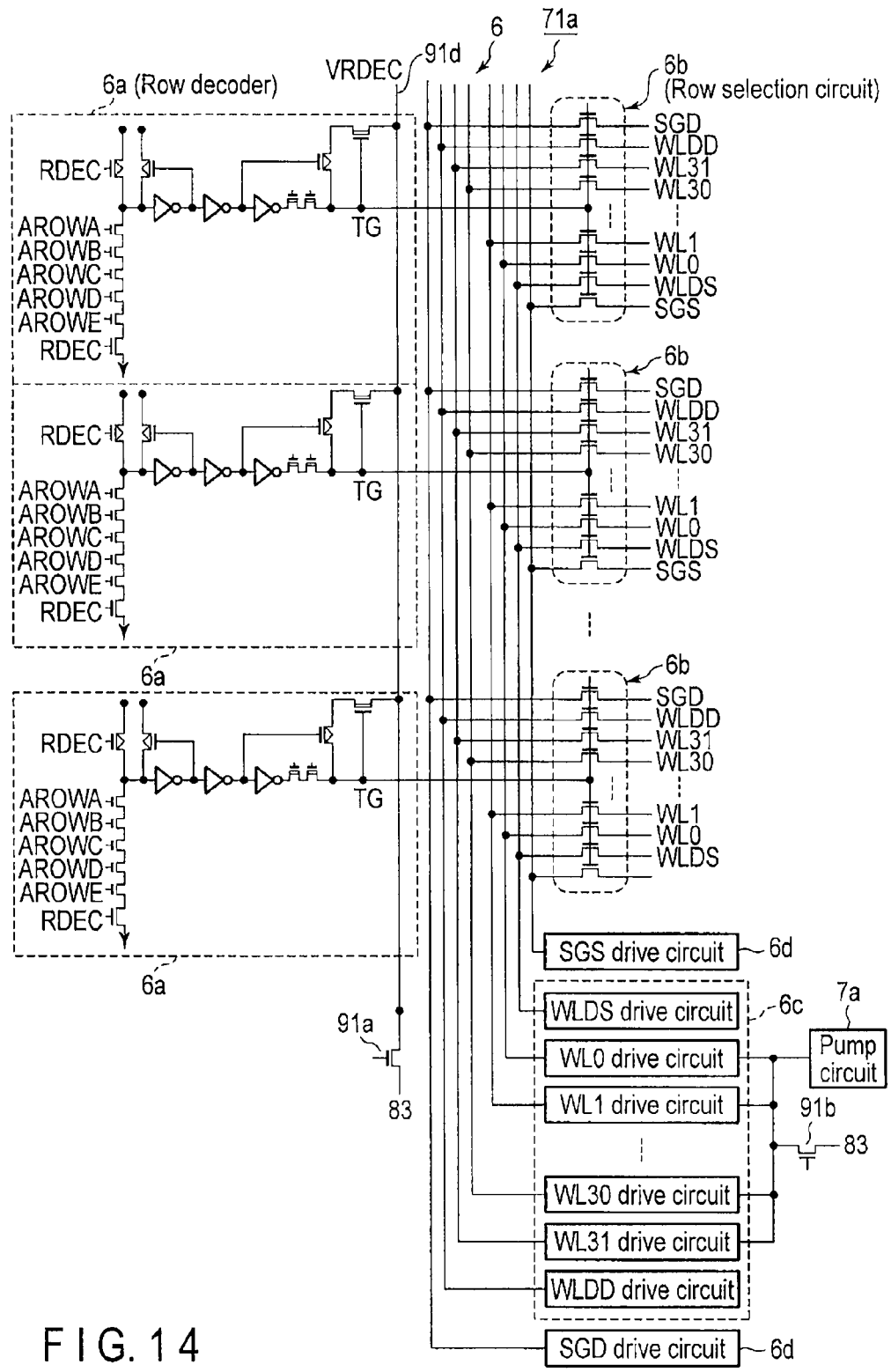
FIG. 14 is a circuit diagram for explaining an example of a circuit in a row system.

FIG. 14 shows an example of a word line control circuit 6 provided in the first chip 71a. This word line control circuit 6 is constituted of, e.g., a plurality of row decoders 6a, a plurality of row selection circuits 6b, a plurality of word line drive circuits (WLDS, WL0 to WL31, a WLDD drive circuit) 6c, a plurality of Select gate drive circuits (an SGS drive circuit, an SGD drive circuit) 6d, and transistors 91a and 91b. Each row decoder 6a and each row selection circuit 6b are provided in accordance with each block in a memory cell array.

Each row decoder 6a selects a corresponding row selection circuit 6b in accordance with a row address. That is, a signal TG as an output signal is supplied from the row decoder 6a having a matched address to the corresponding row selection circuit 6b. Therefore, a transistor connected to a word line and a Select gate of the row selection circuit 6b is turned on.

The plurality of word line drive circuits 6c and the plurality of Select gate drive circuits 6d are connected to the plurality of row selection circuits 6b in common and supply various kinds of voltages generated by a pump circuit 7a to the selected row selection circuit 6b. Therefore, predetermined voltages are supplied to a plurality of word lines and Select gates in a corresponding block through the selected row selection circuit 6b. It is to be noted that the pump circuit 7a is included in a control signal and control voltage generation circuit 7.

On the other hand, a voltage VRDEC is supplied to a wiring line 91d connected to the plurality of row decoders 6a, and the signal TG is generated based on this voltage VRDEC. Each transistor constituting the row selection circuit 6b must transfer a program voltage Vpgm of the word lines without reducing this voltage by an amount corresponding to a threshold voltage of the transistors. Therefore, a voltage of the signal TG, i.e., a maximum voltage of the voltage VRDEC is set to Vpgm+Vth (a threshold voltage of each transistor constituting the row selection circuit 6b) (VPGMH).

One end (S/D) of a current path of the transistor 91a is connected to the wiring line 91d to which the voltage VRDEC is supplied. The other end (D/S) of the current path of this transistor 91a is connected to the wiring line 83 connected between the first and second chips 71a and 71b. Additionally, one end (S/D) of a current path of the transistor 91b is connected to an output end of the pump circuit 7a. The other end (D/S) of the current path of this transistor 91b is also connected to the wiring line 83 connected between the first and second chips 71a and 71b. Operations of these transistors 91a and 91b are controlled by the control signal and control voltage generation circuit 7 in the first chip 71a.

That is, these transistors 91a and 91b are turned on when an operation of each circuit is terminated and electric charge of each circuit is discharged in, e.g., the program operation of the first chip 71a. Therefore, the electric charge of the first chip 71a is transferred to the second chip 71b through the transistor 91a or 91b.

Figure 15:
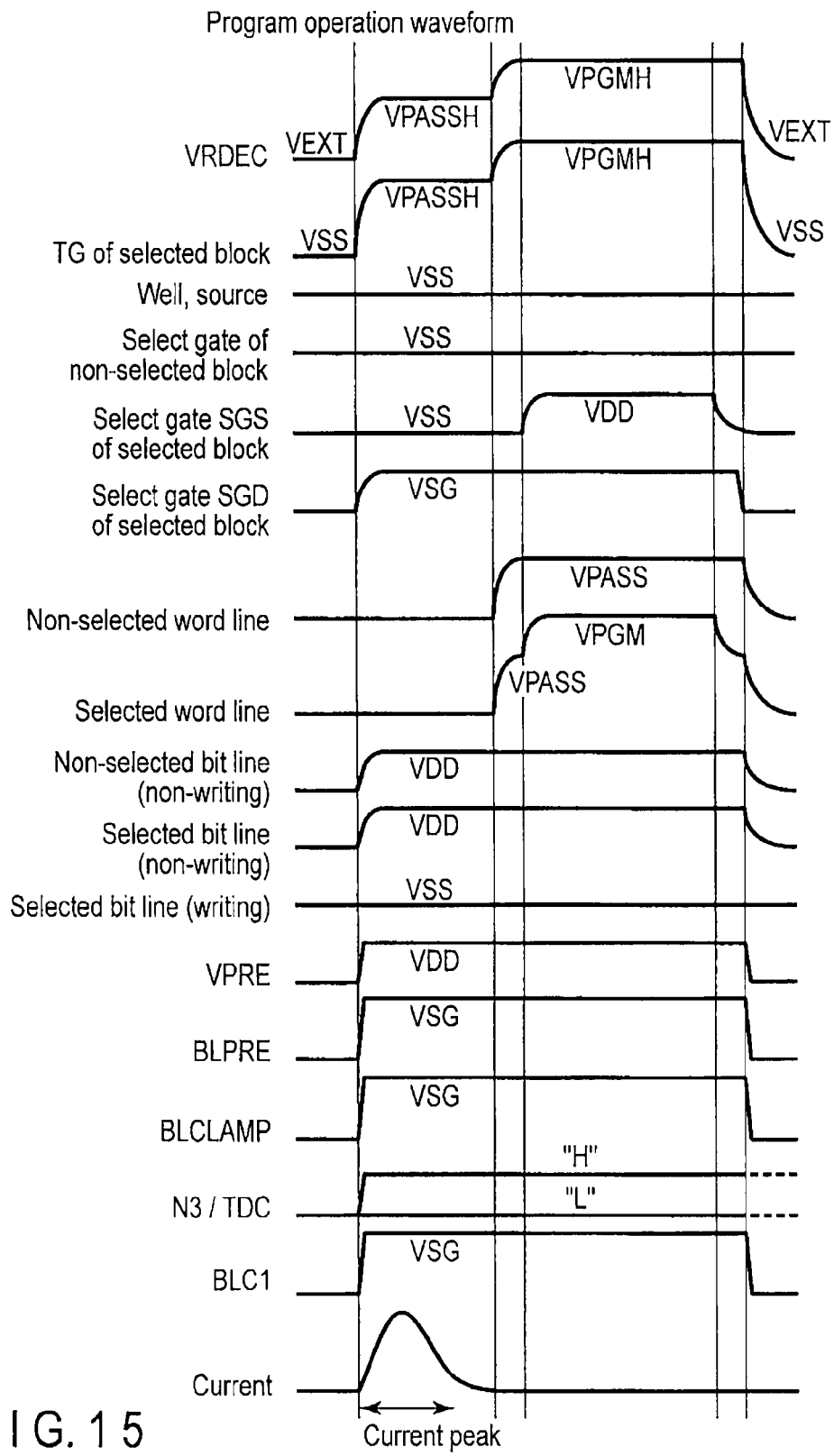
FIG. 15 is a waveform chart showing an example of a program operation of the circuit depicted in FIG. 14.

FIG. 15 shows voltage waveforms of respective units at the time of the program operation. In the program operation, each bit line is set to a predetermined voltage. That is, the bit line BL is set to the voltage VSS at the time of the write operation and set to a non-write voltage, e.g., the voltage VDD at the time of a non-write operation. Further, the voltage VRDEC is boosted from a voltage VEXT to VPASSH (VPASS (a voltage that turns on the memory cell transistor irrespective of data in the memory cell)+Vth (a threshold voltage of each transistor constituting the row selection circuit 6b)), and the signal TG of a selected block is set to the voltage VPASSH. Then, an output voltage of the word line drive circuit 6c is set to VPASS, whereby all the word lines in the selected block are set to VPASS. Furthermore, the signal TG of the selected block is set to VPGMH from the voltage VPASSH, and a selected word line in the selected block is set to the program voltage VPGM, thereby writing data in the memory cell. Therefore, when setting the bit lines and the word lines to these voltages, electric charge supplied from the pump circuit 7a in the first chip 71a is considerably consumed.

When the write operation is terminated, the selected word line in the selected block is subjected to discharge from the program voltage VPGM to a lower level. At this time, the transistor 91b is turned on. As a result, the electric charge in the word line is transferred to the second chip 71b through the wiring line 83.

It is to be noted that timing for turning on the transistor 91a does not have to be equal to that for turning on the transistor 91b, and these timings can be set in conformity to discharge timing of the wiring line.

Figure 16:
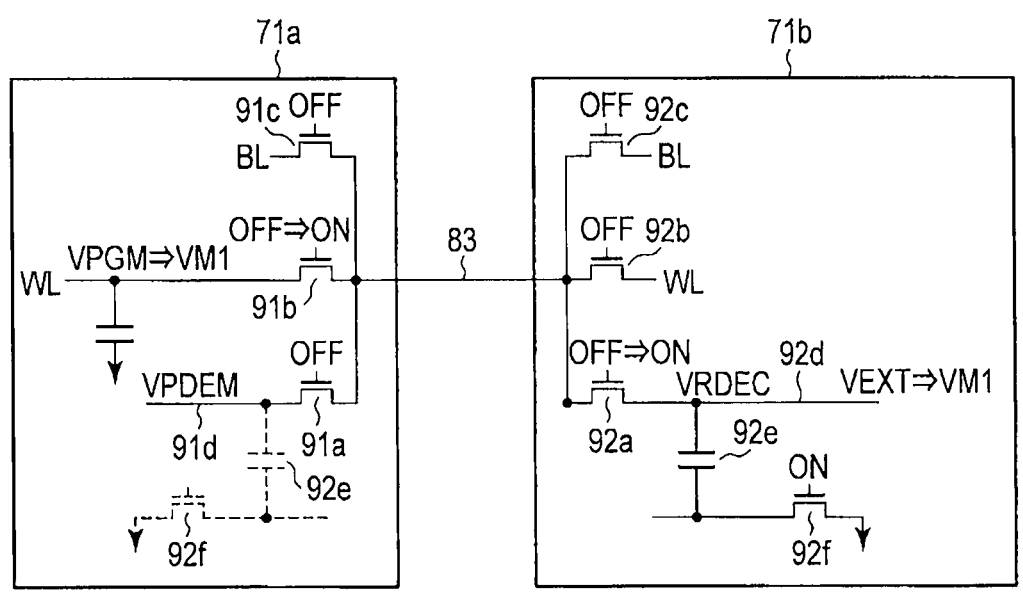
FIG. 16 is a circuit diagram showing a specific example of the semiconductor memory system according to the first embodiment.

FIG. 16 shows a relationship between the first chip 71a and the second chip 71b. In FIG. 16, the same reference numerals denote parts equal to those in FIG. 14.

In FIG. 16, the first chip 71a further has a transistor 91c connected to the bit line BL at one end (S/D) of a current path thereof. The other end (D/S) of the current path of each of the transistors 91a, 91b, and 91c is connected to one end of the wiring line 83 in common. Operation of transistors 91a, 91b, and 91c are controlled by the control signal and control voltage generation circuit 7 in the first chip 71a, for example.

Furthermore, in the second chip 71b, transistors 92a, 92b, and 92c are provided at positions equal to those in the first chip 71a. One end (S/D) of a current path of each of these transistors 92a, 92b, and 92c is connected to a corresponding wiring line, and the other end (D/S) of this current path is connected to the other end of the wiring line 83 in common.

Moreover, a transistor 92f is connected between a wiring line 92d connected to the transistor 92a and the ground through a capacitor 92e. The capacitor 92e and the transistor 92f constitute a charge circuit of the wiring line 92d. It is to be noted that the transistor 92f may be omitted, and one end of the capacitor 92e may be connected to VSS.

Operation of transistors 92a, 92b, 92c, and 92f are controlled by the control signal and control voltage generation circuit 7 in the second chip 71b, for example. In the above-described configuration, for example, when the first chip 71a is performing the program operation, a selected word line is set to VPGM. In this state, if the voltage VRDEC has been set to the power supply voltage VEXT before the second chip 71b starts the program operation, as shown in FIG. 16, the transistor 91b of the first chip 71a is turned on, and the transistors 92a and 92f of the second chip 71b are turned on. Then, the first and second chips 71a and 71b are connected to each other through the transistor 91b, the wiring line 83, and the transistor 92a. Therefore, the electric charge in the word line WL of the first chip 71a is moved to the wiring line 92d to which the signal VRDEC of the second chip 71b is supplied and the capacitor 92e, thereby charging the wiring line 92d and the capacitor 92e. As a result, the selected word line WL of the first chip 71a is changed from the voltage VPGM to VM1 (VEXT<VM1<VPGM), and a voltage of the signal VRDEC of the second chip 71b is increased from VCC to VM1.

In the conventional technology, the voltage VRDEC of the second chip 71b must be boosted from VEXT to VPASSH or VPGMH by using the pump circuit. However, according to the first embodiment, boosting this voltage from VM1 higher than VEXT can suffice. Therefore, the power consumption of the second chip 71b can be suppressed.

Further, when the second chip 71b performs the program operation and this operation is terminated, the electric charge in the second chip 71b can be transferred to the first chip 71a through the wiring line 83 as a reverse pattern of the above example. In this case, the electric charge in WL of the second chip 71b is transferred to VRDEC 91d of the first chip 71a through the transistors 91a and 92b.

Figure 17:
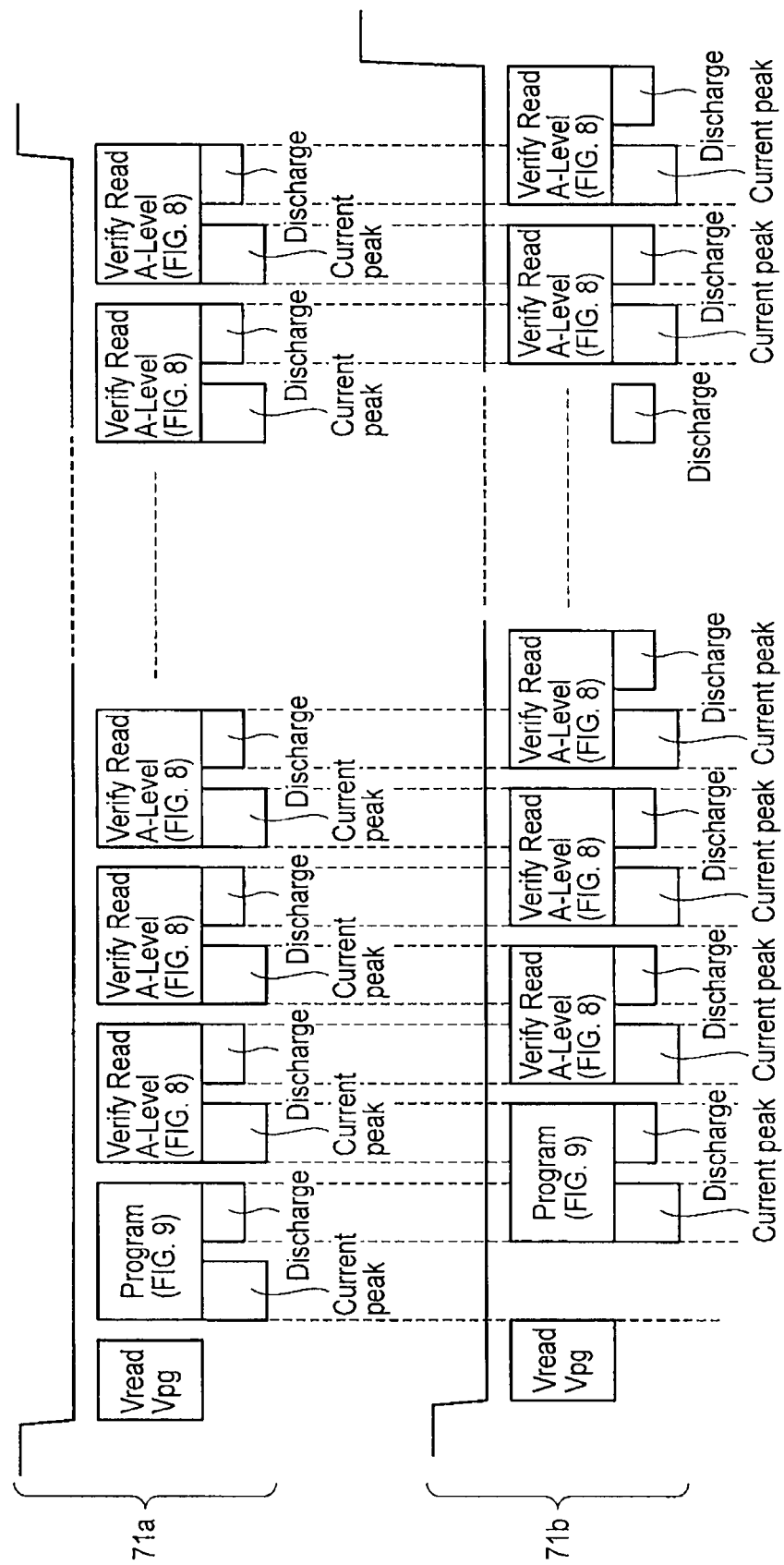
FIG. 17 is a view for explaining an operation in FIG. 16.

FIG. 17 shows how the first and second chips 71a and 71b alternately perform discharge of the electric charge and acquisition of the electric charge. These operations may be controlled by the controller 72 depicted in FIG. 13. Besides, a voltage detection circuit can be provided in each of the first and second chips to detect and control a peak of consumption current. As shown in FIG. 17, for example, the controller 72 first transfers write data to the first chip 71a, and then the first chip 71a enters a program state in response to issue of a command indicative of the write operation. As a result, the consumption current of the first chip 71a achieves a peak. When the consumption current of the first chip 71a achieves a peak, the power supply voltage VEXT is reduced. This reduction in the power supply voltage VEXT is detected by a voltage detection circuit 74b (which will be described later in detail) of the second chip 71b.

Here, the write data is transferred to the second chip 71b by the controller 72, and then a command indicative of the write operation is issued. Since a program voltage Vpgm or Vread is generated, the second chip 71b activates the pump circuit included in the control signal and control voltage generation circuit 7. Thereafter, the program state is attained in a general operation like the first chip 71a, but the voltage detection circuit 74b has detected the reduction in the power supply voltage VEXT, and hence the second chip 71b enters a standby mode without shifting to the program state.

Then, when the program operation of the first chip 71a draws to an end, one of the transistors 91a, 91b, and 91c of the first chip 71a is turned on, and the electric charge is discharged from the first chip 71a to the wiring line 83.

Furthermore, when the program operation of the first chip 71a draws to an end, a current consumption is reduced. Therefore, when the voltage detection circuit 74b of the second chip 71b detects that the power supply voltage VEXT has returned to a predetermined level, one of the transistors 92a, 92b, and 92c of the second chip 71b is turned on, and the electric charge discharged from the first chip 71a to the wiring line 83 is acquired by the second chip 71b. In this state, the program of the second chip 71b starts.

In this manner, the voltage detection circuits 74a and 74b provided in the first and second chips 71a and 71b monitor the power supply voltage VEXT to prevent current peaks of the first and second chips 71a and 71b from overlapping, and the electric charges in the first and second chips 71a and 71b are reused in the second and the first chips 71b and 71a.

Although the electric charge is transferred to the second chip 71b when the first chip 71a discharges VPGM in the selected word line WL in the first embodiment, the first embodiment is not restricted thereto, and the electric charge can be likewise transferred when, e.g., discharging the voltage VPASS in all the word lines WL of a selected block in the first chip 71a, discharging the voltage VREAD in the read operation, or discharging the voltage in each bit line BL.

Moreover, the second chip 71b acquires the electric charge from the first chip 71a when boosting the voltage VRDEC from the power supply voltage VEXT. However, the first embodiment is not restricted thereto, and the electric charge transferred from the first chip 71a can be used when, e.g., boosting the voltage in all the word lines WL in a selected block of the second chip 71b to the voltage VPASS, boosting the voltage VREAD in the read operation, or charging each bit line BL.

Additionally, when setting a predetermined voltage in the second chip 71b to perform the write, read, or erase operation and then discharging the voltage in the second chip 71b, the electric charge may be transferred for, e.g., the write, read, or erase operation of the first chip 71a. In this case, the capacitor 92e and the transistors 92f and 92g may be likewise provided in the first chip 71a.

Further, although large behaviors of the consumption currents in the first and second chips 71a and 71b are detected by the voltage detection circuits 74a and 74b, the embodiment is not restricted thereto, the voltage detection circuits 74a and 74b may be omitted, and the controller 72 may control operations of the first and second chips 71a and 71b.

According to the first embodiment, the first and second chips 71a and 71b are connected to each other through the wiring line 83, and the electric charge in the first or second chip 71a or 71b is transferred to the second or first chip 71b or 71a through the wiring line 83 when the operation of the first or second chip 71a or 71b is terminated. Therefore, boosting a voltage higher than a usual voltage by the pump circuit in the chip having the electric charge transferred thereto can suffice, the consumption power can be suppressed, and a time required for boosting can be reduced.

Additionally, transferring the electric charge between the plurality of chips enables reducing the consumption current in the system. Therefore, when the system is driven by a battery, consumption power of the battery can be suppressed.

It is to be noted that each of the first and second chips 71a and 71b and the controller 72 may include the voltage detection circuit. This voltage detection circuit converts a current flowing through each of the first and second chips 71a and 71b and the controller 72 into a voltage and detects the current flowing through each of the first and second chips 71a and 71b and the controller 72 as a voltage value. Based on this detection result, the voltage detection circuit in the first chip 71a can monitor operation states of the second chip 71b and the controller 72, and the voltage detection circuit in the second chip 71b can monitor operation states of the first chip 71a and the controller 72. Further, the voltage detection circuit in the controller 72 can monitor operation states of the first and second chips 71a and 71b. An output signal from each voltage detection circuit is supplied to the control signal and control voltage generation circuit 7 of each of the first and second chips 71a and 71b including this voltage detection circuit, and an output signal from the voltage detection circuit in the controller 72 is supplied to, e.g., a non-illustrated CPU constituting the controller 72.

FIG. 18 shows an example of a voltage detection circuit provided in the first chip 71a. The voltage detection circuit 74a is constituted of voltage division resistances R1 and R2 and an operation amplifier OPA. The voltage division resistances R1 and R2 are connected in series between, e.g., power supply terminals 76a and 76b in the first chip 71a. The power supply terminal 76a is connected to the power supply line 81 through, e.g., a metal wire, and the power supply voltage VEXT is supplied to the power supply terminal 76a. The power supply terminal 76b is connected to the ground wiring line 82 through, e.g., a metal wire, and the ground voltage VSS is supplied to the ground terminal 76b. A connection node of the resistances R1 and R2 is connected to one input end of the operation amplifier OPA. A reference voltage Vref is supplied to the other input end of this operation amplifier OPA.

In this configuration, for example, a current flowing through the first chip 71a is converted into a voltage by the voltage division resistances R1 and R2, and the converted voltage is detected. This detected voltage is compared with the reference voltage Vref in the operation amplifier OPA. If the detected voltage is a voltage larger than the reference voltage Vref (consumption currents in the first chip 71a and the other circuits are small), an output signal from the operation amplifier OPA is changed to the high level.

On the other hand, if the detected voltage is a voltage smaller than the reference voltage Vref (the consumption currents in the first chip 71a and the other circuits are large), the output signal from the operation amplifier OPA is changed to the low level.

For example, when the second chip 71b is in the program operation state, a consumption current in the second chip 71b achieves a peak. With this achievement, when the power supply voltage VEXT is lowered and the output signal from the operation amplifier OPA of the voltage detection circuit 74a in the first chip 71a is changed to the low level, the first chip 71a can recognize that the consumption current in the second chip 71b is in the peak state. Therefore, the control signal and control voltage generation circuit 7 of the first chip 71a delays the start of, e.g., the program operation that consumes a large current. As a result, a further reduction in the power supply voltage VEXT can be prevented.

When the voltage detection circuit provided in each of the first and second chips 71a and 71b and the controller 72 has detected the reduction in the power supply voltage VEXT as described above, the standby mode may be started without carrying out the program operation or the ECC processing, and the program operation or the ECC processing may be controlled to be executed after the power supply voltage VEXT returns to a predetermined level.

Second Embodiment

FIG. 19 shows a second embodiment, and the same reference numerals denote parts equal to those in FIG. 17.

In the second embodiment, a larger amount of electric charge can be transferred from a first chip 71a to a second chip 71b as compared with the first embodiment. Therefore, in FIG. 19, a transistor 92g is connected to a transistor 92a and a capacitor 92e in parallel.

In the above-described configuration, when transferring electric charge from a word line WL of the first chip 71a to a wiring line 92d of the second chip 71b, a transistor 91b of the first chip 71a is first turned on, and the transistors 92a and 92f of the second chip 71b are turned on. In this state, a voltage in the wiring line 92d is VM1 as described above.

Thereafter, the transistors 92a and 92f are turned off, and the transistor 92g is turned on. Then, the voltage in the word line WL of the first chip 71a is changed from the voltage VM1 to VM2 lower than VM1 (VM2<VM1), and a node ND of the second chip 71b also has VM2. Therefore, a potential in the wiring line 92d is boosted through the capacitor 92e, whereby a voltage VRDEC in the wiring line 92d is a voltage of VM1+VM2.

This voltage is higher than the voltage VM1 in the wiring line 92d in the first embodiment. Therefore, a pump circuit of the second chip 71b can boost the voltage from VM1+VM2. Repeating this pump operation using the transistor 92g and the capacitor 92e enables transferring a higher voltage from the first chip 71a to the second chip 71b.

According to the second embodiment, when the transistor 92g is connected to the transistor 92a and the capacitor 92e in parallel and the transistor 92g is turned on, the voltage VRDEC in the wiring line 92d can be boosted through the capacitor 92e. Therefore, a consumption current in the pump circuit of the second chip 71b can be suppressed, thereby further suppressing consumption power of the second chip 71b.

Third Embodiment

FIG. 20 shows a third embodiment. In the first and second embodiments, the dedicated wiring line 83 is provided between the first and second chips 71a and 71b, and the electric charge is transferred between the first and second chips 71a and 71b through this wiring line 83.

On the other hand, in the third embodiment, a dedicated wiring line is not provided, and electric charge is transferred between first and second chips 71a and 71b through a power supply line 81.

That is, as shown in FIG. 20, in the first chip 71a, for example, a word line WL is connected to the power supply line 81 through high-voltage transistors 101a and 102a. These transistors 101a and 102a are controlled by a control signal and control voltage generation circuit 7 of the first chip 71a.

Further, in the second chip 71b, for example, the word line WL is connected to the power supply line 81 through high-voltage transistors 101b and 102b. These transistors 101b and 102b are controlled by a control signal and control voltage generation circuit 7 of the second chip 71b.

For example, when a program operation of the first chip 71 is terminated, the transistors 101a and 102a are turned on, and electric charge in the word line WL is discharged to the power supply line 81. At this time, an intermediate voltage lower than VPGM is applied to a gate electrode of the transistor 102a (101a) to prevent overshoot of a power supply voltage VEXT.

Then, when the second chip 71b performs, e.g., the program operation, since a reduction in the power supply voltage VEXT of the power supply line 81 is avoided, a predetermined voltage can be boosted at a high speed. Furthermore, when the program operation is terminated, an intermediate potential is supplied to a gate electrode of each of the transistors 101b and 102b of the second chip 71b, and electric charge in the word line WL is discharged to the power supply line 81 via the transistors 101b and 102b.

According to the third embodiment, the electric charge in the first and second chips 71a and 71b is transferred to the power supply line 81 through the transistors 101a, 102a, 101b, and 102b. Therefore, a reduction in the power supply voltage VEXT of the power supply line 81 can be suppressed. Therefore, consumption power can be reduced, and a speed of the boosting operation can be increased.

It is to be noted that, in the first chip 71a, the electric charge in the word line WL is transferred to the power supply line 81 through the two transistors 101a and 102a. However, the third embodiment is not restricted thereto, and the word line WL can be connected to the power supply line 81 via, e.g., one transistor 103. The second chip 71b can be also modified like the first chip 71a.

Fourth Embodiment

Figure 21:
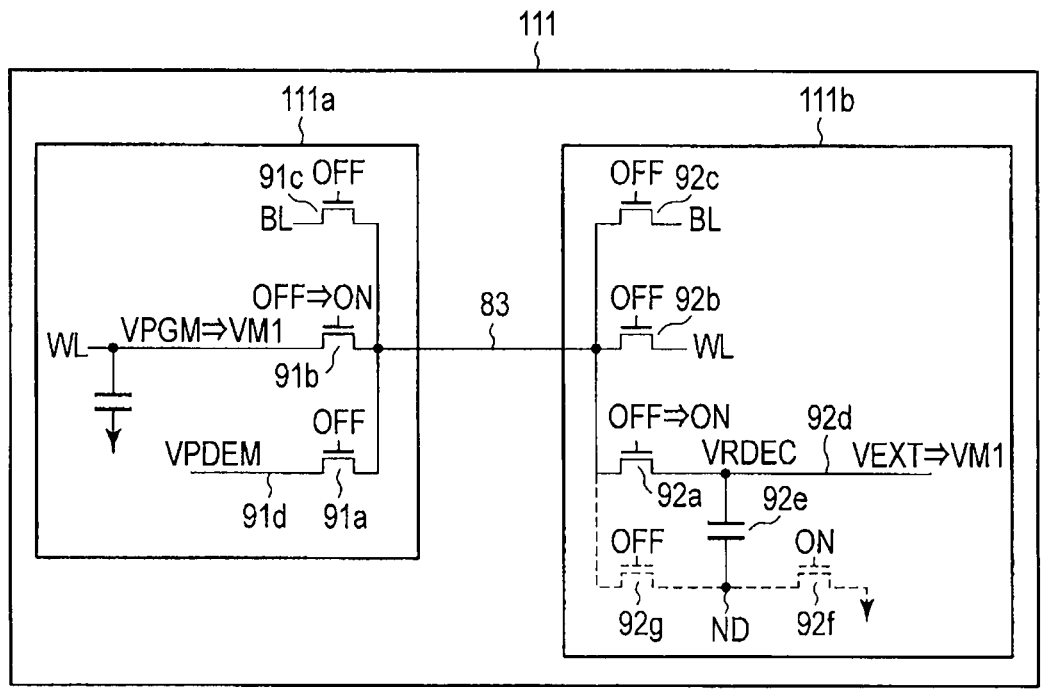
FIG. 21 is a circuit diagram showing a fourth embodiment.
Figure 22:
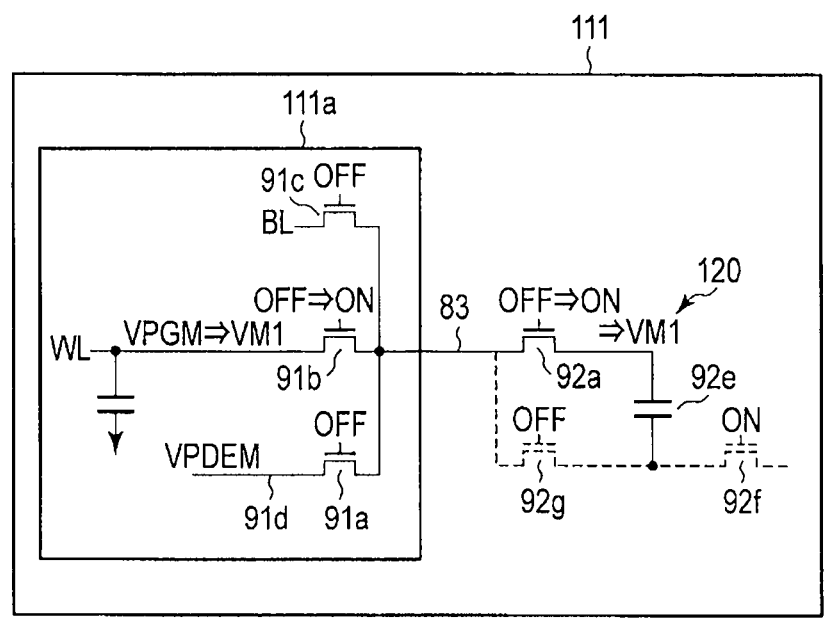
FIG. 22 is a circuit diagram showing a modification of the fourth embodiment.

FIG. 21 and FIG. 22 show a fourth embodiment. In the first to third embodiments, the electric charge is transferred between the plurality of chips to reuse the electric charge. On the other hand, in the fourth embodiment, electric charge is transferred between, e.g., a plurality of memory cell arrays provided in one chip to reuse the electric charge, and this embodiment can be combined with all of the first to third embodiments.

In FIG. 21, a chip 111 has first and second memory cell arrays 111a and 111b. Each of the first and second memory cell arrays 111a and 111b has the same configuration as those depicted in FIG. 2 and FIG. 3. Furthermore, the first and second memory cell arrays 111a and 111b are connected to each other through a wiring line 83 like the examples shown in FIG. 17 and FIG. 19, the first memory cell array 111a has transistors 91a, 91b, and 91c, and the second memory cell array 111b has transistors 92a, 92b, 92c, 92f, and 92g and a capacitor 92e. For example, the wiring line 83 is a wiring layer of the chips 111.

These transistors 91a, 91b, 91c, 92a, 92b, 92c, 92f, and 92g are controlled by a control signal and control voltage generation circuit 7.

In the above-described configuration, for example, when a program operation of the first memory cell array 111a is terminated, the transistors 91b, 92a, and 92f are turned on, and electric charge in the first memory cell array 111a is transferred to the second memory cell array 111b through the transistor 91b, the wiring line 83, the transistors 92a and 92f, and the capacitor 92e. Therefore, in the second memory cell array 111b, since a voltage VRDEC is boosted from VM1 higher than a power supply voltage VEXT, consumption current can be reduced, and a speed of the boosting operating can be increased.

Furthermore, after the end of, e.g., the program operation in the second memory cell array 111b, electric charge in the second memory cell array 111b is transferred to the first memory cell array 111a by an operation opposite to that described above.

According to the fourth embodiment, when the plurality of memory cell arrays are provided in one chip, the electric charge can be transferred between these memory cell arrays. Therefore, the electric charge can be reused by the plurality of memory cell arrays, thereby reducing the consumption current.

(Modification)

FIG. 22 shows a modification of the fourth embodiment, and like reference numerals denote parts equal to those in FIG. 21. In the fourth embodiment, the electric charge is transferred between the plurality of memory cell arrays. On the other hand, in this modification, a charge storage unit 120 is connected to one memory cell array 111a through a wiring line 83. This charge storage unit 120 is constituted of, e.g., a transistor 92a and a capacitor 92e. Moreover, like FIG. 19 and FIG. 21, transistors 92f and 92g may be provided.

In the above-described configuration, in the memory cell array 111a, for example, the transistors 91b and 92a are turned on when a program operation is terminated. Then, electric charge in a selected word line WL of the memory cell array 111a is transferred to the capacitor 92e through the transistor 91b, the wiring line 83 and the transistor 92a. Therefore, a voltage in the capacitor 92e is boosted to VM1. Additionally, when the transistors 92f and 92g are turned on as described above, the voltage in the capacitor 92e can be boosted to VM2 higher than VM1.

As described above, for example, when a data read operation is executed in the memory cell array 111a, the transistor 91c and the transistor 92a are turned on, whereby the electric charge stored in the charge storage unit 120 is supplied from the capacitor 92e to a bit line BL through the transistor 92a, the wiring line 83, and the transistor 91c. Therefore, boosting a potential in the bit line BL from VM1 or VM2 by a pump circuit can suffice.

As described above, according to this modification, the charge storage unit 120 connected to the memory cell array 111a is provided in the chip 111, the discharged electric charge generated due to a given operation of the memory cell array 111a is stored in the charge storage unit 120, and the electric charge stored in this charge storage unit 120 can be reused for another operation of the memory cell array 111a. Therefore, consumption power of the chip 111 can be reduced, and a boosting time can be shortened.

It is to be noted that, in the first, second, and third embodiments, the voltage detection circuits 74a and 74b are provided in the first and second chips 71a and 71b, and these voltage detection circuits 74a and 74b are utilized for monitoring mutual operations, thereby controlling the electric charge transfer operation. However, the embodiment is not restricted thereto, and it is possible to adopt a configuration that a communication circuit is provided between the first and second chips 71a and 71b to monitor mutual operations without using the voltage detection circuits 74a and 74b, thus controlling the electric charge transfer operation.

(Modification)

In the first to fourth embodiments, charges are transferred between chips or memory cell arrays in the chips. Thereby power consumption is reduced by reusing charges. However, recently, there is tendency to increase current consumption and the heat generated by the chip poses a problem with this.

In the modification, the heat generated by at least one chip is converted to electric energy by using a thermoelectric converter and reused by at least one chip. It is possible for this to suppress the problem of the heat generated by chip.

Figure 23:
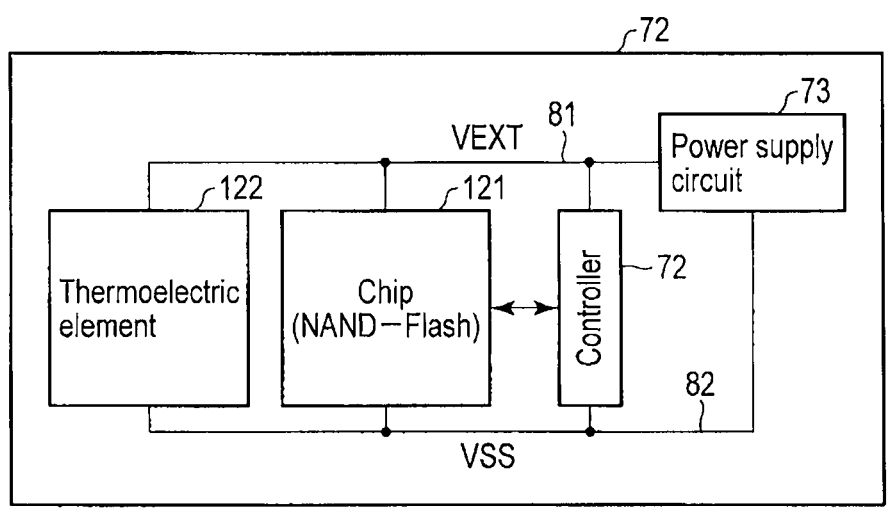
FIG. 23 is a diagram showing a modification of the first to fourth embodiments.

FIG. 23 shows a semiconductor memory system including a NAND flash memory and a thermoelectric converter. In FIG. 23, the same reference numerals are used to designate the corresponding portions of the first to fourth embodiments.

A NAND flash memory chip 121 is the same as the chips of the first to fourth embodiments. For example, a thermoelectric element 122 which converts thermal energy into electric energy using the Seebeck effect, is coupled to the chip 121. The thermoelectric element 122 is connected to the power supply lines 81 and 82. Heat generated by the chip 121 is converted to electric energy by the thermoelectric element 122 and supplied to the power supply lines 81 and 82.

Figure 24:
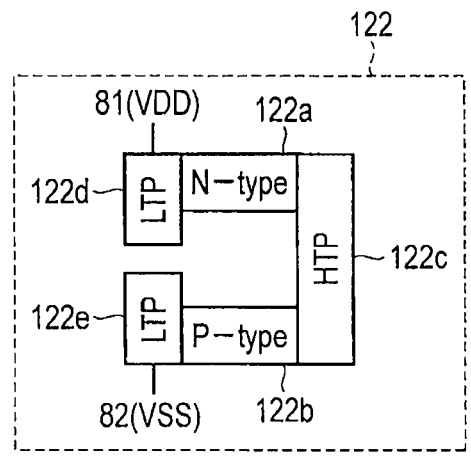
FIG. 24 is a view showing an example of a thermoelectric convert element.

FIG. 24 shows example of the thermoelectric element 122. As described above, the thermoelectric element 122 is the thermoelectric element which used, for example, the Seebeck effect. The thermoelectric element 122 is constituted by N-type semiconductor element (N-type) 122a, P-type semiconductor element (P-type) 122b, a first conductor coupled to one end thereof as a higher temperature portion (HTP) 122c and second conductors coupled to another end of elements 122a and 122b as a lower temperature portions (LTP) 122d and 122e. The thermoelectric element 122 generates a voltage in response to a difference in a temperature between the higher temperature portion 122c and the lower temperature portions 122d and 122e, of the N-type semiconductor element 122a and the P-type semiconductor element 122b. The generated voltage is supplied to the power supply lines 81 and 82 coupled to the lower temperature portions 122d and 122e, respectively.

Figure 25:
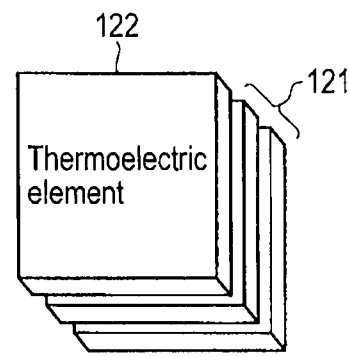
FIG. 25 is a view showing a relation between the thermoelectric converting element and chips.

As shown in FIG. 25, the higher temperature portion 122c (not shown) is provided on uppermost chip of stacked NAND flash memory chips 121, for example. The lower temperature portion 122d and 122e (not shown) are opposite to the higher temperature portion 122c, and separate from the chips. The stacked NAND flash memory chips 121 can be constituted by one chip.

Figure 26:
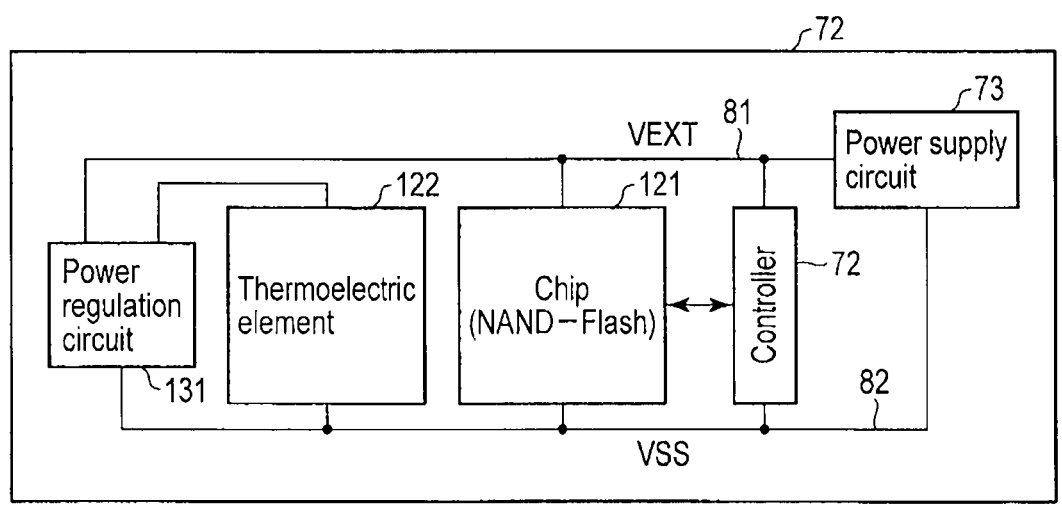
FIG. 26 is a diagram showing a modification of FIG. 23.

FIG. 26 shows a modification of FIG. 23, and shows a power regulation circuit 131 inserted between the thermoelectric element 122 and the power supply lines 81 and 82. The power regulation circuit 131 regulates a voltage generated by the thermoelectric element 122, and then supplies the regulated voltage to the chip 121 as a power voltage.

Moreover, since the heat generated from the chip 121 is not constant, a voltage generated by the thermoelectric element 122 may not be constant. Thus, it may use a capacitor holding charges instead of the power regulation circuit 131 to adjust the generated voltage to a constant level.

Fifth Embodiment

In the first to fourth embodiments, the discharged electric charge in each chip is transferred to a different chip, and it is reused in the different chip. However, when a write operation is not executed in each chip, the transferred electric charge is consumed as thermal energy in the chip. Therefore, a temperature of the chip is increased.

In the fifth embodiment, when the discharged electric charge is not used in any chip, it is consumed as thermal energy outside the chips to avoid an increase in chip temperature.

FIG. 27 shows the fifth embodiment, and in the fifth embodiment, the same parts as those in the first to fourth embodiment are indicated by the same reference numerals. It is to be noted that the R/B signal is omitted.

In FIG. 27, an MCP 70 is arranged on a system board 141. This system board 141 is implemented for an application of, e.g., a mobile phone or a personal computer. A system LSI 142 that controls an operation of the application is mounted on this system board 141. This system LSI 142 is connected to a controller 72 provided to the MCP 70.

When using the system LSI 142 to access first and second chips 71a and 71b in the MCP 70, write data into the first and second chips 71a and 71b, or read data from the first and second chips 71a and 71b, a data write command or read command is issued from the system LSI 142, and it is supplied to the controller 72.

In the MCP 70, the first and second chips 71a and 71b include first and second pump circuits 7a-1 and 7a-2 as booster circuits. Operations of these first and second chips 71a and 71b are controlled by the controller 72 as described above.

Further, a resistance R1 is connected to a wiring line 83 arranged between the first and second chips 71a and 71b through a switch SW1. This switch SW1 is constituted of, e.g., an MOS transistor, and it is formed together with a peripheral circuit (not shown) and the like in the MCP 70. The resistance R1 is placed outside the MCP 70 and formed on the system board 141.

The switch SW1 is controlled by a switch control signal SC1 output from the controller 72. To control writing and reading data into/from the first and second chips 71a and 71b, the controller 72 can detect power consumption states of the first and second chips 71a and 71b. Specifically, as described above, the controller 72 can detect that a write operation with large power consumption is performed in one of the first and second chips 71a and 71b when a voltage in a power supply line 81 is lowered from a transmission voltage VEXT. And, it can detect that the write operation is terminated when the voltage in the power supply line 81 is restored to the power supply voltage VEXT. Therefore, when both the first and second chips 71a and 71b do not consume large power, the controller 72 discharges surplus electric charge through the resistance R1 provided outside the MCP 70 to avoid heat generation of the first and second chips.

Figure 28:
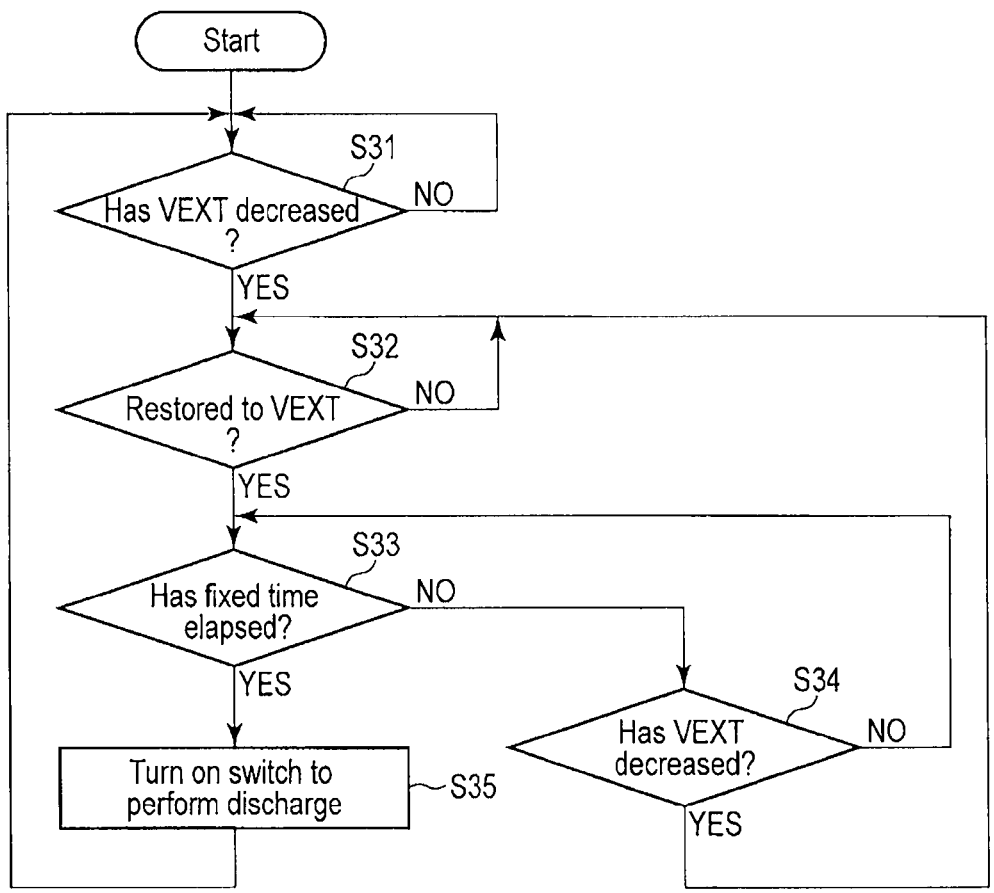
FIG. 28 is a flowchart showing an operation of the fifth embodiment.

FIG. 28 shows an example of an operation of the controller 72 according to the fifth embodiment.

The controller 72 judges whether the voltage in the power supply line 81 has been lowered from the power supply voltage VEXT (S31). When it is determined that the power supply voltage VEXT has been lowered as a result of the judgment, since an operation with large power consumption, e.g., a write operation is being executed, whether the voltage in the power supply line 81 has been restored to the power supply voltage VEXT is then judged (S32). When it is consequently determined that the write operation or the like is finished and the voltage has been restored to the power supply voltage VEXT, a discrimination is made upon whether a fixed time, e.g., 20 to 30 μm has passed (S33). When the fixed time has not passed as a result of the judgment, the write operation or the like is again started, and whether the power supply voltage VEXT has been again lowered is judged (S34). When the power supply voltage VEXT has been lowered as a result of the judgment, it goes to the step S32.

At the step S33, when the fixed time has passed, i.e., when the power supply voltage VEXT is not reduced even in a state that the fixed time has passed after the restoration of the voltage in the power supply line 81 to the power supply voltage VEXT, it is determined that the write operation, which consumes large power, is not performed in the other of the first and second chips 71a and 71b. Therefore, a switch control signal SC1 is output from the controller 72, and the switch SW1 is turned on. When the switch SW1 is turned on, surplus electric charge in the first and second chips 71a and 71b is discharged to the resistance R1 on the system board 141 through the switch SW1, and it is converted into thermal energy by the resistance R1.

According to the fifth embodiment, the resistance R1 provided on the system board 141 can be connected to the wiring line 83 through the switch SW1, and the switch SW1 is turned on by the controller 72 to discharge the surplus electric charge to the resistance R1 when the surplus electric charge is produced in the first and second chips 71a and 71b. Thus, as compared with a case that the surplus electric charge is discharged in the first and second chips 71a and 71b, heat generation of the first and second chips 71a and 71b can be avoided. Therefore, reliability of the first and second chips 71a and 71b can be improved.

Sixth Embodiment

FIG. 29 shows a sixth embodiment. In the sixth embodiment, the same parts as those in the fifth embodiment are indicated by the same reference numerals.

In the fifth embodiment, the switch SW1 is connected to the wiring line 83 that connects the first and second chips 71a and 71b. By contrast, in the sixth embodiment, switches are arranged in first and second chips 71a and 71b, respectively.

That is, the first chip 71a includes a switch SW2, and one end of the switch SW2 is connected to, e.g., a discharge path of a first pump circuit 7a-1. The other end of the switch SW2 is connected to a resistance R1 arranged on a system board 141. In addition, the second chip 71b includes a switch SW3, and one end of the switch SW3 is connected to, e.g., a discharge path of a second pump circuit 7a-2. The other end of the switch SW3 is connected to the resistance R1 arranged on the system board 141.

The switch SW2 is controlled by a switch control signal SC2 output from a controller 72, and the switch SW3 is controlled by a switch control signal SC3 output from the controller 72. The switches SW2 and SW3 are controlled as in the fifth embodiment. That is, the switches SW2 and SW3 can be simultaneously turned on/off, or they can be individually turned on/off.

For example, when the switches SW2 and SW3 are individually controlled, the switch SW2 is turned on by the switch control signal SC2, after the operation of the first pump circuit 7a-1 is completed and specified time elapsed. As a result, surplus electric charge in the first pump circuit 7a-1 is discharged to the resistance R1 through the switch SW2. Furthermore, after the operation of the first pump circuit 7a-2 is completed and specified time elapsed, the switch SW3 is turned on by the switch control signal SC3. As a result, surplus electric charge in the second pump circuit 7a-2 is discharged to the resistance R1 through the switch SW3.

The sixth embodiment can obtain the same advantage as that of the fifth embodiment. Moreover, according to the sixth embodiment, when the switches SW2 and SW3 are individually controlled, the surplus electric charge can be accurately discharged in accordance with the operations of the first and second pump circuits 7a-1 and 7a-2, and heat generation of the first and second chips 7a-1 and 7a-2 can be highly accurately controlled.

Seventh Embodiment

FIG. 30 shows a seventh embodiment. In the seventh embodiment, the same parts as those in the sixth embodiment are indicated by the same reference numerals.

In the sixth embodiment, the switches SW2 and SW3 are provided in the first and second chips 71a and 71b, respectively, and these switches SW2 and SW3 are controlled by the controller 72. By contrast, in the seventh embodiment, switches SW2 and SW3 are controlled using a signal RCLK (shown in, e.g., FIGS. 9 and 10) generated by a control voltage and control signal generation circuit 7 in accordance with a current peak generation period. The signal RCLK is generated in accordance with a period during which a peak current is produced in a program operation or a verify read operation. That is, the signal RCLK functions as a state signal indicating that first and second chips 71a and 71b are in a state that power consumption is large. Each of the first and second chips 71a and 71b has an output end from which the signal RCLK is output and an input end from which the signal RCLK is received, and these chips supply or receive the signal RCLK to or from each other and control the switches SW2 and SW3.

Specifically, the first chip 71a receives the signal RCLK output from the second chip 71b, and the switch SW2 is controlled by this signal RCLK. The second chip 71b receives the signal RCLK output from the first chip 71a, and the switch SW3 is controlled by this signal RCLK.

That is, when the first chip 71a is in, e.g., a write state, the second chip 71b is not executing an operation which consumes large power, e.g., a write operation. Therefore, the switch SW3 of the second chip 71b is turned on by the signal RCLK supplied from the first chip 71a, and surplus electric charge in a second pump circuit 7a-2 is discharged to a resistance R1 through the switch SW3.

Additionally, when the second chip 71b is in, e.g., a write state, the first chip 71a is not executing an operation which consumes large power, e.g., a write operation. Therefore, the switch SW2 of the first chip 71a is turned on by the signal RCLK supplied from the second chip 71b, and surplus electric charge in a first pump circuit 7a-1 is discharged to the resistance R1 through the switch SW2.

It is to be noted that an operation for transferring the surplus electric charge to the second or first chip 71b or 71a after completion of the write operation of the first or second chip 71a or 71b is the same as that in each of the foregoing embodiments.

The transmission/reception of the signal RCLK in the first and second chips 71a and 71b is enabled by using, e.g., a through silicon via (TSV).

FIG. 31 shows a configuration in which the TSV is applied to stacked chips including the first and second chips 71a and 71b.

The first and second chips 71a and 71b are provided on a system board 141 through a chip 151 constituting, e.g., an interface. The chips including a chip 151 and the first and second chips 71a and 71b are connected to each other via the TSVs 161. It is to be noted that a system LSI is omitted in FIG. 31.

FIG. 32 shows, e.g., the first chip 71a, and it shows an example that memory cell arrays 1 are arranged on one chip. TSVs 161 are provided at a central part of the first chip 71a. The number of the TSVs 161 is arbitrary. Arbitrary two of these TSVs 161 are used as an output end from which the signal RCLK is output and an input end from which the signal RCLK is received.

The TSVs 161 are likewise formed in the second chip 71b, a TSV 161 associated with the output end of the first chip 71a is used as an input end, and a TSV 161 associated with the input end of the first chip 71a is used as an output end. Therefore, when the first and second chips 71a and 71b are stacked, the TSVs 161 associated with the output end and the input end of the first chip 71a are brought into contact with the TSVs 161 associated with the input end and the output end of the second chip 71b, and thereby connecting these chips.

FIG. 33 shows a structural example of the TSVs 161. Since the configuration of the TSV 161 is known, description will be omitted.

According to the seventh embodiment, the signal RCLK output from the first chip 71a is received by the second chip 71b, the signal RCLK output from the second chip 71b is received by the first chip 71a, and these signals RCLK are used to control the switches SW2 and SW3 provided on the first and second chips 71a and 72b. Therefore, since the switches SW2 and SW3 can be directly controlled using the signals RCLK without interposing the controller 72, a high-speed operation can be obtained, and heat generation of the first and second chips 71a and 71b can be avoided.

It is to be noted that each TSV 161 is used to transfer the signal RCLK, but it is not restricted thereto, and the TSV may be used in place of, e.g., the wiring line 83. Further, the TSV 161 may be used to connect the switches SW1 to SW3 to the resistance R1.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory system comprising:
   a first semiconductor memory device;
   a second semiconductor memory device; and
   a wiring line connected between the first semiconductor memory device and the second semiconductor memory device,
   wherein, when one of the first and second semiconductor memory devices discharges electric charge, the other of the first and second semiconductor memory device receives the discharged electric charge through the wiring line.

2. The system according to claim 1,
   wherein the first semiconductor memory device has at least one first transistor whose current path is connected to a first circuit which performs discharge or charge of the electric charge at one end thereof and also connected to one end of the wiring line at the other end thereof,
   the second semiconductor memory device has at least one second transistor whose current path is connected to the other end of the wiring line at one end thereof and also connected to a second circuit which performs charge or discharge of the electric charge at the other end thereof, and
   the first and second transistors are turned on when one of the first and second semiconductor memory devices discharges the electric charge and the other of the first and second semiconductor memory devices receives the discharged electric charge.

3. The system according to claim 2,
   wherein each of the first and second semiconductor memory devices is constituted of a semiconductor chip.

4. The system according to claim 2,
   wherein each of the first and second semiconductor memory devices is constituted of a memory cell array.

5. The system according to claim 3,
   wherein the wiring line is a power supply line.

6. The system according to claim 2,
   wherein each of the first and second semiconductor memory devices discharges the electric charge to the wiring line when one of at least a program operation and a verify operation draws to an end.

7. The system according to claim 2,
   wherein the first semiconductor memory device has a first voltage detection circuit which detects a power supply voltage,
   the second semiconductor memory device has a second voltage detection circuit which detects the power supply voltage,
   the first semiconductor memory device delays start of at least a program operation and a verify operation when the first voltage detection circuit has detected a reduction in the power supply voltage, and
   the second semiconductor memory device delays start of at least the program operation and the verify operation when the second voltage detection circuit has detected a reduction in the power supply voltage.

8. The system according to claim 2, further comprising:
   a capacitor having a first terminal connected to the other end of the second transistor; and
   a third transistor whose current path is connected to a second terminal of the capacitor at one end thereof and grounded at the other end thereof.

9. The system according to claim 8, further comprising:
   a fourth transistor whose current path is connected to the other end of the wiring line at one end thereof and also connected to a second terminal of the capacitor at the other end thereof.

10. The system according to claim 5, further comprising:
    a controller configured to control operations of the first and second semiconductor memory devices;
    a switch connected to the wiring line, the switch being turned on by the first controller when the first controller determines that the first and second semiconductor memory devices are in a small power consumption state; and
    a resistance connected to the switch, the resistance being provided outside the first and second semiconductor memory devices.

11. The system according to claim 6, further comprising:
    a third chip including the semiconductor memory system and a second controller configured to control the semiconductor memory system; and
    a printed substrate having the first, second, and third chips and the resistance arranged thereon.

12. The system according to claim 11,
    wherein the first, second, and third chips are stacked and arranged on the printed substrate, each of the first, second, and third chips has through silicon vias, and the wiring line is connected through a first through silicon via of the through silicon vias.

13. The system according to claim 12,
    wherein each of the first, second, and third chips outputs a state signal indicative of an operation state of each chip through a second through silicon via of the through silicon vias, and the first controller controls the switch based on the state signal.

* * * * *